United States Patent
Kim

(10) Patent No.: US 8,711,711 B2
(45) Date of Patent: Apr. 29, 2014

(54) SYSTEM AND METHOD OF DETECTING AND LOCATING INTERMITTENT AND OTHER FAULTS

(75) Inventor: Charles J. Kim, Annandale, VA (US)

(73) Assignee: Howard University, Washington, DC (US)

( * ) Notice: Subject to any disclaimer, the term of this patent is extended or adjusted under 35 U.S.C. 154(b) by 334 days.

(21) Appl. No.: 13/089,906

(22) Filed: Apr. 19, 2011

(65) Prior Publication Data

US 2011/0242989 A1    Oct. 6, 2011

Related U.S. Application Data

(63) Continuation-in-part of application No. 12/464,561, filed on May 12, 2009, and a continuation-in-part of application No. 12/262,664, filed on Oct. 31, 2008, now Pat. No. 8,102,779.

(51) Int. Cl.
*H04L 12/26*    (2006.01)

(52) U.S. Cl.
USPC ........... 370/242; 370/240; 370/241; 340/500; 340/531; 715/771; 702/181

(58) Field of Classification Search
USPC .................................................. 370/240–242
See application file for complete search history.

(56) References Cited

U.S. PATENT DOCUMENTS

| | | | |
|---|---|---|---|
| 4,022,988 A | 5/1977 | Lentz et al. | |
| 4,414,539 A * | 11/1983 | Armer | ............................ 340/500 |
| 4,868,826 A | 9/1989 | Smith et al. | |
| 4,887,041 A | 12/1989 | Mashikian | |
| 4,929,887 A | 5/1990 | Robitaille et al. | |
| 5,029,274 A | 7/1991 | Goff | |
| 5,237,511 A | 8/1993 | Caird et al. | |
| 5,448,176 A | 9/1995 | Mashikian | |
| 5,600,248 A | 2/1997 | Westrom | |
| 5,682,100 A | 10/1997 | Rossi et al. | |
| 5,729,144 A | 3/1998 | Cummins | |
| 5,784,393 A | 7/1998 | Byers | |

(Continued)

FOREIGN PATENT DOCUMENTS

| JP | 2002158668 | 5/2002 |
|---|---|---|
| WO | 2006120757 A1 | 11/2006 |

OTHER PUBLICATIONS

International Search Report dated Oct. 30, 2012 relating to PCT/US2012/033543.

(Continued)

*Primary Examiner* — Oommen Jacob
(74) *Attorney, Agent, or Firm* — Fitch, Even, Tabin & Flannery LLP

(57) ABSTRACT

Data associated with at least one building condition or status is sensed by one or more sensors. The data from these sensors may be sent over a data bus and received by the central computer. In addition, a modulated signal may be transmitted by one or both of the transmitters across the data bus. The modulated signal is received at the receiver, which analyzes the received modulated signal, and determines whether an intermittent fault has occurred on the data bus based upon the analyzing. For example, the receiver may compare the received signal to an expected pattern and when a discrepancy exists, an intermittent fault is determined to exist. The receiver may also determine the location of the fault based upon the analysis.

7 Claims, 16 Drawing Sheets

(56) References Cited

U.S. PATENT DOCUMENTS

| | | | |
|---|---|---|---|
| 5,790,537 | A | 8/1998 | Yoon et al. |
| 6,181,140 | B1 | 1/2001 | Vokey |
| 6,198,401 | B1 | 3/2001 | Newton et al. |
| 6,313,642 | B1 | 11/2001 | Brooks |
| 6,385,561 | B1 | 5/2002 | Soraghan |
| 6,477,475 | B1 | 11/2002 | Takaoka et al. |
| 6,646,447 | B2 | 11/2003 | Cern |
| 6,725,176 | B1 | 4/2004 | Long et al. |
| 6,759,851 | B2 | 7/2004 | Hazelton |
| 6,842,011 | B1 | 1/2005 | Page |
| 6,856,936 | B1 | 2/2005 | Chen |
| 6,868,357 | B2 | 3/2005 | Furse |
| 6,927,579 | B2 | 8/2005 | Blades |
| 6,934,655 | B2 | 8/2005 | Jones |
| 6,965,303 | B2 | 11/2005 | Mollenkopf |
| 6,972,574 | B2 | 12/2005 | Allan |
| 7,286,041 | B2 | 10/2007 | Enrico |
| 7,319,574 | B2 | 1/2008 | Engel |
| 7,368,919 | B2 | 5/2008 | Gervais |
| 7,432,720 | B1 | 10/2008 | Quaife |
| 7,999,667 | B2 * | 8/2011 | Carralero et al. .............. 340/531 |
| 2002/0062460 | A1 | 5/2002 | Okuda |
| 2003/0085715 | A1 | 5/2003 | Lubkeman et al. |
| 2003/0125893 | A1 | 7/2003 | Furse |
| 2003/0222747 | A1 | 12/2003 | Perkinson et al. |
| 2004/0017203 | A1 | 1/2004 | Becker |
| 2005/0049754 | A1 * | 3/2005 | Ogawa et al. ................. 700/275 |
| 2005/0231326 | A1 | 10/2005 | Enrico |
| 2005/0289408 | A1 * | 12/2005 | Jani et al. ....................... 714/712 |
| 2006/0012376 | A1 | 1/2006 | Furse et al. |
| 2006/0061325 | A1 | 3/2006 | Tang et al. |
| 2006/0061368 | A1 | 3/2006 | Furse |
| 2006/0121321 | A1 | 6/2006 | Laukhuf |
| 2006/0176629 | A1 * | 8/2006 | Graube ............................ 361/58 |
| 2007/0191987 | A1 | 8/2007 | Dang et al. |
| 2007/0202839 | A1 | 8/2007 | Abraham et al. |
| 2007/0217414 | A1 | 9/2007 | Berkman et al. |
| 2007/0223165 | A1 | 9/2007 | Itri et al. |
| 2008/0054741 | A1 * | 3/2008 | Oyama ....................... 310/68 A |
| 2008/0183424 | A1 * | 7/2008 | Seem ............................ 702/181 |
| 2008/0273527 | A1 | 11/2008 | Short et al. |
| 2009/0045925 | A1 * | 2/2009 | Demin et al. ............. 340/310.11 |
| 2009/0083583 | A1 * | 3/2009 | Seem et al. ...................... 714/39 |
| 2009/0144023 | A1 * | 6/2009 | Seem ............................ 702/181 |
| 2009/0228223 | A1 | 9/2009 | Liu et al. |
| 2010/0100259 | A1 * | 4/2010 | Geiter ............................... 701/3 |
| 2010/0110828 | A1 | 5/2010 | Russo et al. |
| 2010/0111521 | A1 | 5/2010 | Kim |
| 2010/0171630 | A1 | 7/2010 | Carralero et al. |
| 2010/0232298 | A1 * | 9/2010 | Karam ........................... 370/241 |
| 2011/0061015 | A1 * | 3/2011 | Drees et al. .................... 715/771 |
| 2011/0178977 | A1 * | 7/2011 | Drees ............................. 706/52 |
| 2011/0242989 | A1 | 10/2011 | Kim |
| 2012/0119753 | A1 | 5/2012 | Kim |
| 2012/0259583 | A1 * | 10/2012 | Noboa et al. ................. 702/179 |

OTHER PUBLICATIONS

International Search Report dated Dec. 14, 2010 relating to PCT/US2010/034228.

Sandia Report; Unlimited Release, Printed Sep. 2006 R. Kevin Howard, Steven F. Glover, Gary E. Pena, Matthew B. Higgins, Larry X. Schneider and Thomas R. Lockner (38 pgs.).

IBEE Sensors Journal, vol. 5, No. 6, Dec. 2005; Feasibility of Spread Spectrum Sensors for Location of Arcs on Live Wires Cynthia Furse, Senior Member, IEEE, Paul Smith, Member, IEEE, Mehdi Safavi, and Chet Lo, Member, IEEE (6 pgs.).

Sub-Cycle Overcurrent Protection for Self-Cleaning Faults Due to Insulation Breakdown Ljubomir A. Kojovic, Charles W. Williams, Jr., (12 pgs.).

International Search Report dated Dec. 22, 2009 relating to PCT/US2009/061779.

V.B. Prasad, "The Effects of Intermittent Faults in the Reliability of Digital Systems", IEEE Southeastern '90. Proceedings, vol. 3. pp. 948-952, Apr. 1990.

I. Hakki Cavdar, "Performance Analysis of FSK Power Line Communications Systems Over the Time-Varying Channels: Measurements and Modeling", IEEE Transactions on Power Delivery, vol. 19, issue 1, pp. 111-117, Jan. 2004.

Chun-Hung Liu, Eric Wade, and H. Harry Asada, "Reduced-Cable Smart Motors Using DC Power Line Communication", IEEE International Conference on Robotics and Automation, Proceedings, vol. 4., pp. 3831-3838, 2001.

Paul Smith, Cynthia Furse, and Jacob Gunther, "Analysis of Spread Spectrum Time Domain Reflectometry for Wire Fault Location", IEEE Sensors Journal, vol. 5, No. 6, Dec. 2005.

Slenski, G.A., Walz, M.F., "Novel Technologies for Improving Wire System Integrity", Ninth Aging Aircraft Conference, Atlanta, Mar. 6-9, 2006.

Dr. Paul Smith and Dr. Cynthia Furse, "State of the Art—Live Wire Testing"; http://livewiretest.com/Personal Web page. htm; 27 pages.

Charles Kim and Nicholas Johnson, "Detection of Intermittent Faults in Aircraft Electrical Wire by Utilizing Power Line Communication", 9th joint FAA/DOD/NASA Conference on Aging Aircraft, Mar. 7, 2006, Atlanta, GA.

V. Taylor, and M. Faulkner, "Line Monitoring and Fault Location Using Spread Spectrum on Power Line Carrier", IEE Electronics Letters, vol. 143, issue 5, pp. 427-434, Sep. 1996.

"ST7537HS1"—Home Automation Modem, SGS-Thomson Microelectronics, 1995.

"Power Line Modem Application—Remote Control Using ST7537 and ST6: Application Note", SGS-Thomson Microelectronics, 1994.

"ST7357—Power Line Application Modem Application Note", SGS-Thomson Microelectronics, 1995.

Charles Kim and Michael Carraleo, "Functionality Test of PLC Data Error Approach for Detecting Intermittent Faults", 11th joint FAA/DOD/NASA Conference on Aging Aircraft, Apr. 21-24, 2008.

International Search Report dated Dec. 14, 2009 relating to PCT/US2009/061770.

* cited by examiner

1 = PREAMBLE BYTE
2 = RECEIVER BYTE
3 = TRANSMITTER INFORMATION BYTE
4 TO m = MESSAGE BYTES

SYSTEM AND METHOD OF DETECTING AND LOCATING INTERMITTENT AND OTHER FAULTS

CROSS REFERENCES TO RELATED APPLICATIONS

This application is a continuation-in-part of application Ser. No. 12/464,561 filed May 12, 2009 and entitled "System and Method of Detecting and Locating Intermittent and Other Faults" naming Charles Kim as an inventor and having, which is a continuation-in-part of application Ser. No. 12/262,664 filed Oct. 31, 2008 and entitled "System and Method of Detecting and Locating Intermittent Electrical Faults in Electrical Systems" naming Charles Kim as inventor and having, the contents of both of which are incorporated herein by reference in their entireties.

FIELD OF THE INVENTION

This application relates to approaches for detecting and/or locating electrical faults in electrical systems or networks.

BACKGROUND

Intermittent electrical faults are physical events that manifest themselves occasionally and in often unpredictable ways within electrical systems or networks. When an intermittent fault occurs in a system, the system may produce erroneous results or could fail. To take some specific examples of particular electrical faults that occur in networks, a wire may rub against a neighboring wire and a small electrical arc may be created as a result of the contact. In another example, a clamp may break through the insulation surrounding the wire and touch the wire creating a fault. In yet another example, a wire may break at the back end of a connector thereby creating a fault. In still another example, corrosion may create intermittent non-contact between wires and pins within a given system. In another example, cracks on wires within the system may have water dripping on them (or the wires may be in contact with other substances) thereby creating electrical faults. Internal coil turn-to-turn insulation in electric machines may also fail in systems with electrical coils creating electrical faults.

The consequences of intermittent electrical faults can be severe and, in many instances, can cause substantial damage to the electrical equipment, can result in injury to users, or can even cause the loss of human life. For instance electrical fires may be sparked because of the occurrence of some electrical faults. When the faults occur in aircraft, fuel tank explosions may occur if electrical faults occur near a fuel tank. Even if catastrophic damage or injury does not occur, the operational lifetime of machines or systems may be reduced as the result of the occurrence of intermittent electrical faults. One characteristic of intermittent faults is that they are random and unpredictable. Their recurrence is also unpredictable. However, if an intermittent fault is left undetected and un-repaired, a major, disastrous, and permanent fault might follow that may cause deaths, failures, or destruction.

Previous attempts at identifying electrical faults have relied upon the visual or instrument-aided inspection of electrical systems. However, various disadvantages exist with these previous approaches. For example, the operation of the system frequently had to be suspended to determine if a fault existed thereby causing various problems such as loss of revenue for the owner or operator of the system. Moreover, many locations within existing systems were frequently hard to reach and/or observe thereby severely limiting the effectiveness of these approaches. These previous approaches also proved unable to detect the fault in many cases since the duration of the fault was often short and the system would behave normally as if nothing happened after this short-lived intermittent fault event. Therefore, it was relatively easy for the observer to miss the occurrence of the fault. Additionally, these approaches often relied upon intrusive placement of any equipment used frequently leading to at least some disruption of the existing system.

Other previous approaches relied upon transmitting electromagnetic waves across the network being observed. In one previous example, pulses were transmitted in networks and any reflections were analyzed to determine if a fault existed. More specifically, incident standing waves or impulses were transmitted and then reflected in the network, and then the time between the incident pulse and the reflected pulse was calculated to determine the distance to the location where the pulse was reflected. Different criteria were then used to determine if the reflection was a potential fault. One problem with this technique was that any change in the wire material (e.g., a branch-out in the network) reflected the incident waves resulting in erroneous fault determination. Another problem with this technique was that it required the transmission of high voltage pulses, which some electrical systems with thin coils (e.g., with short wires or thin windings) could not endure. Another time domain reflectometry method employed spread-spectrum techniques, but this approach did not solve the above-mentioned problems since high voltage pulse transmission was still required and reflection still occurred on branches of the electrical network.

Another previous approach transmitted direct-sequence spread-spectrum modulated signals, instead of high voltage signals, and employed signal processing techniques in an attempt to find and locate electrical faults. These approaches, however, still relied on reflectometry that is, sending incident signal and receiving reflected signal and the timing of them for distance calculation. As a result, although this approach may have, under some circumstances, overcome the need to use high voltage incident voltage pulses, it still had the problem of reflection occurring at all points of branching in the network and in the devices that were connected.

Still another problem of the reflectometry approach was that the location of the device must be close to one end of the electrical system, either the line end or the source end. Otherwise, the injected signal would be reflected from both ends and result in a combined, distorted, and reflected signal. This requirement of locating the device at either end is very difficult to meet since many electrical networks are connected in a complicated format, often in a mesh architecture.

Figure 1:
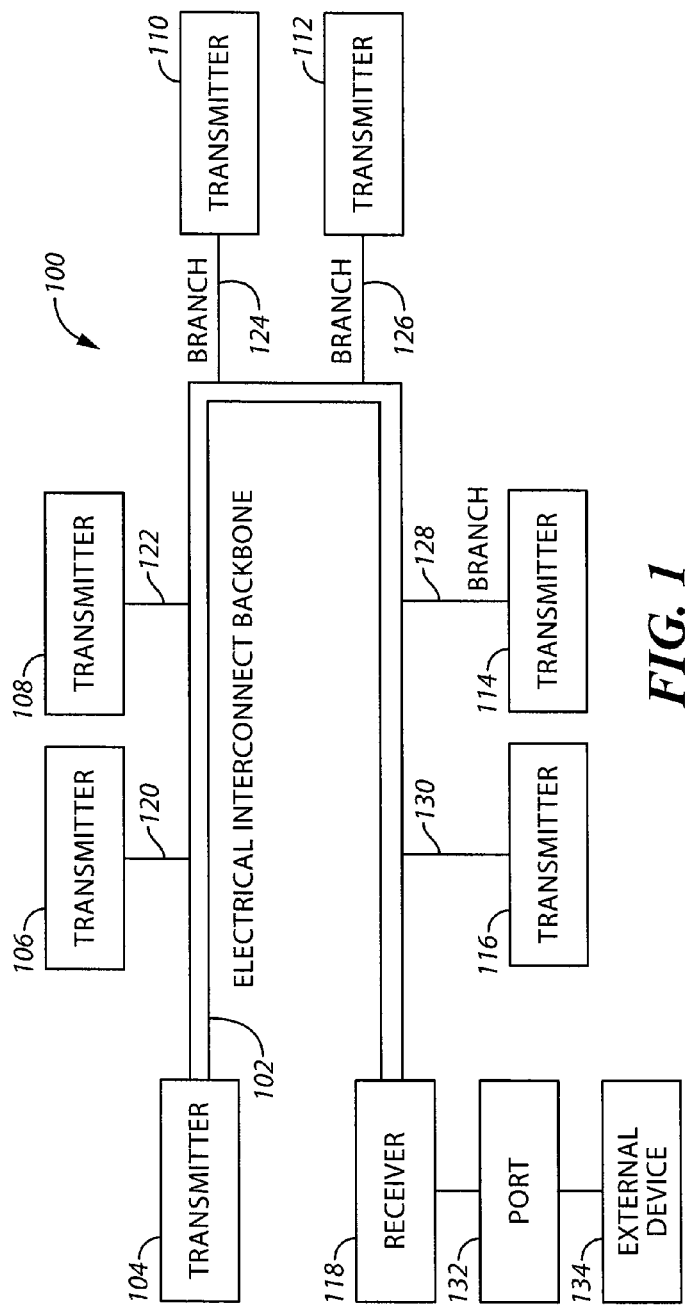
FIG. 1 comprises a block diagram of a fault determination system according to various embodiments of the present invention.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION OF THE PREFERRED EMBODIMENTS

Approaches are provided to detect the presence and locations of faults within an electrical or other type of networks (e.g., optical networks). The approaches utilize one or more transmitters to send signals (e.g., packets) over electrical wires (or other types of conductors that transmit any type of signal) to one or more receivers via a coupler in each of these devices. Based upon the mismatch between the signal sent and the signal received at the receiver(s) due to the distortion in the signal transmission caused by the transient of intermittent fault, the presence and/or location of electrical (or other types of) faults is determined. These coupling arrangements for signal injection and reception can also be made in two split half-couplers. By separating the coupler into a wire-side half-coupler and an in-controller half-coupler of a transmitter or receiver, the controller can become portable and wirelessly exchange carrier signals with the electrical network via the wire-side half-coupler. The approaches described herein are easy and cost effective to use, do not rely upon the transmission of high voltage signals, can be installed at any location within the electrical network, are an effective detection solution for the unpredictable intermittent event of faults that occur between transmitter and receiver, and are not susceptible to the problems of previous approaches.

In many of these embodiments, a signal is conducted from a controller module onto an electrical network via a first magnetic coupling. The signal is transmitted across the electrical network and received at one or more receiver modules via one or more second magnetic couplings. At the one or more receiver modules, the received signal is analyzed and based upon the analysis, a determination is made as to whether a fault has occurred in the electrical network. The first magnetic coupling and the one or more second magnetic couplings may each comprise a transformer having a primary winding and a secondary winding.

In some examples, the first magnetic coupling is selectively activated and deactivated to effect the connection and disconnection of the controller module from the electrical network.

In other examples, the signal is transmitted across the network to a plurality of receivers and wherein each of the receiver modules includes a separate magnetic coupling. In other examples, the signal is broadcast to one or more receivers. The signal may be broadcast to different receiver module groupings at different times and at different frequencies.

Another advantage of the present approaches is that they can be used to determine and locate faults in any wired network that is disposed at any location. For example, these approaches can be utilized in all types of vehicles (e.g., cars, trucks, ships, aircraft), buildings (e.g., schools, power plants, homes, offices, across wide areas (e.g., college campuses, office parks, cities, countries), and appliances (e.g., generators, consumer appliances) to mention a few examples.

In others of these embodiments, data associated with at least one building condition or status is sensed by one or more sensors. For example, the temperature in a building or whether a door is open or closed may be sensed. The data from these sensors may be sent over a data bus and received by the central computer or controller. Then, a modulated signal may be transmitted by a transmitter across the data bus. Other modulated signals may be transmitted by other transmitters. The modulated signal is received at the receiver, which analyzes the received modulated signal, and determines whether an intermittent fault has occurred on the data bus based upon the analyzing. For example, the receiver may compare the received signal to an expected pattern and when the comparison determines that a discrepancy exists, an intermittent fault is determined to exist. The receiver may also determine the location of the fault based upon the analysis.

In other aspects, a modulated signal is transmitted across the power bus by other transmitter(s). The modulated signal is received by another receiver and the receiver analyzes the received modulated signal and determines whether an intermittent fault has occurred on the power bus based upon the analysis. For example, the receiver may compare the received signal to an expected pattern and when a discrepancy exists, an intermittent fault is determined to be present. The receiver may also determine the location of the fault on the power bus based upon the analysis.

In some of these examples, the modulated signals on the data or power buses are transmitted from multiple transmitters to a single receiver. Other configurations are possible (e.g., multiple transmitters to multiple receives, a single transmitter to single receiver, a single transmitter to multiple receivers).

In still other aspects, a first modulated signal is transmitted by one of the transmitters. When the first modulated data signal is received at the receiver without significant distortion at a receiver, a second modulated signal on the data bus is transmitted from one of the sensors or central computer, or user interface, over the data bus. The second modulated signal is received at the receiver and the received second modulated signal is analyzed to determine if an intermittent fault exists on the data bus (e.g., by comparing it to an expected pattern).

In yet other aspects, the sensors may be any type of sensing device such as a temperature sensor, a radioactivity sensor, a motion sensor, a pressure sensor, and a humidity sensor. Other examples are possible.

In other aspects, one or more of the sensors that are disposed in the building sense a condition or status associated with the building or an element associated with the building. A plurality of modulated signals indicating this information are transmitted via the bus that is disposed in the building. Each of the plurality of modulated signals is modulated according to an approach that avoids interference between each of the plurality of signals. The plurality of modulated signals from the at least one sensing device are received, for example, at a central computer, and the central computer or controller in the building (or located outside the building at a remote location) processes the data in the received modulated signals.

In other aspects, a modulated signal is transmitted from a transmitter and across the power bus that is coupled to the sensors. The modulated signal is received at the receiver and the received modulated signal is analyzed. A determination is made as to whether an intermittent fault has occurred on the power bus based upon the analysis. A similar approach can be used on the data bus to determine if intermittent faults are present on the data bus.

Various forms of modulation may be used. For example, amplitude shift keying (ASK) modulation, frequency shift keying (FSK) modulation, Phase shift keying (PSK) modulation, Binary shift keying (BSK) modulation, Binary Phase shift keying (BPSK) modulation, quadrature phase shift keying (QPSK) modulation, offset quadrature phase shift keying (OQPSK) modulation, minimum shift keying (MSK) modulation, Gaussian minimum shift keying (GMSK), multiple phase shift keying (M-PSK), Π/4 QPSK modulation may be used. Other examples of modulation are possible.

In other aspects, a vehicle includes one or more sensors are configured to sense data associated with the vehicle (e.g., interior temperature), a status of the vehicle (e.g., vehicle moving), or an element of the vehicle (e.g., an engine condition). A central computer receives and processes the data from the sensors via the data bus. A modulated signal is transmitted by the transmitter and transmitter via the data bus. The modulated signal is received at the receiver, the receiver analyzes the received modulated signal, and the receiver determines whether an intermittent fault has occurred on the data bus based upon the analysis. The location of the fault may also be determined using any of the approaches described herein.

In other aspects, a modulated signal is transmitted by one or more of the transmitters across a power bus (that is coupled to the sensors). The modulated signal is received at the receiver which analyzes the received modulated signal and determines whether an intermittent fault has occurred on the power bus based upon the analyzing. A location for the fault may also be determined according to the approaches described herein.

Referring now to FIG. 1, one example of an approach for determining and detecting electrical faults in an electrical network 100 is described. An electrical interconnect backbone 102 is coupled to transmitters 104, 106, 108, 110, 112, 114 and 116 via electrical branches 120, 122, 124, 126, 128 and 130 respectively. The electrical interconnect backbone 102 is also connected to a receiver 118. The electrical interconnect backbone 102 may be any type of electrical connection of any voltage level or any current type, e.g., direct or alternating. For instance, the backbone 102 may include two wires (e.g., one ground and the other a wire transmitting a DC current and voltage). Other examples of backbone arrangements and any number of electrical wires are possible to distribute electrical power. In one example, electrical sources having voltages of approximately 100 vRMS (or 28V DC) are distributed across the backbone 102 and the branches of the network 100.

The transmitters 104, 106, 108, 110, 112, 114 and 116 are any type of device capable of transmitting any type of modulated signal, over electrical circuit 102 without compromising the power delivering function of the electrical network 102, that includes any type of information. For example, the transmitters 104, 106, 108, 110, 112, 114 and 116 may include controllers to form packets or messages, modems to convert the messages to suitable signals through modulation (e.g., having the proper voltage levels) for transmission, and a coupling network to provide filtering and protective functions to connect any of the transmitters to the electrical interconnect backbone 102. As mentioned, the transmitters 104, 106, 108, 110, 112, 114 and 116 may operate and transmit packets or messages at any voltage level appropriate for the electrical interconnect backbone 102.

The receiver 118 is any device capable of receiving modulated signals from any of the transmitters 104, 106, 108, 110, 112, 114 and 116 via the electrical interconnect backbone 102. As with the transmitters 104, 106, 108, 110, 112, 114 and 116, the receiver 118 may include a controller, a modem and a coupling network. As mentioned, the coupling network buffers the receiver or transmitter from the electrical interconnect backbone 102 by a filtering function so that the receiver or transmitter insulates it from the high voltages of the electrical network while effectively sending and receiving the modulated signal. The modem in the transmitter modulates the digital signal formed by the controller and the modulated signal travels through the coupling network into the electrical network. The modem in the receiver accepts the modulated signal via the coupling network sent from the transmitters, demodulates the signals into a digital byte format, and sends the digital data to its controller. The receiver controller processes the signals for data errors or mismatch to determine whether a fault has been detected or the likelihood that a fault has been detected and/or the possible location of faults. Various error rates can be determined from the process.

The receiver 118 communicates with a port 132 and the port 132 is coupled to an external device 134. The external device 134 may be a personal computer, display, enunciator or any other type of device that is capable of alerting a user that a fault has been detected somewhere in the network 100. The location of faults and message error rate calculated for the location may also be displayed to give the severity (likelihood) or status of the fault progress. In an alternative approach, the external device 134 may provide some or all of the fault determination processing capabilities rather than the receiver 118 when the receiver 118 is limited to provide the mismatch or error occurrence only.

In one example of the operation of the system of FIG. 1, the transmitters 104, 106, 108, 110, 112, 114 and 116 transmit messages to the receiver 118. The receiver 118 analyzes the messages that it receives and based upon the results of the analysis determines whether a fault exists, the likelihood that a fault exists, and/or the possible (or determined) location(s) of faults (e.g., within a particular branch 120, 122, 124, 126 and 128 or 130 of the network 100). It will be appreciated that although a single receiver is shown in the example of FIG. 1, any number of receivers may be used in the network 100. Additionally, any number of transmitters may be employed in the network 100.

Once errors are detected and/or their locations determined remedial action can be taken. For example, a user can access the potential site of the error, determine if a problem exists, and, if a problem exists remedy the problem (e.g., replace a wire). It will be appreciated that the system of FIG. 1 can be disposed at any location such as within a vehicle (e.g., car, truck, aircraft, or ship), within an appliance, or within a building. Further, the system of FIG. 1 can be disposed across multiple locations such as in various types of networking arrangements or configurations.

Figure 2:
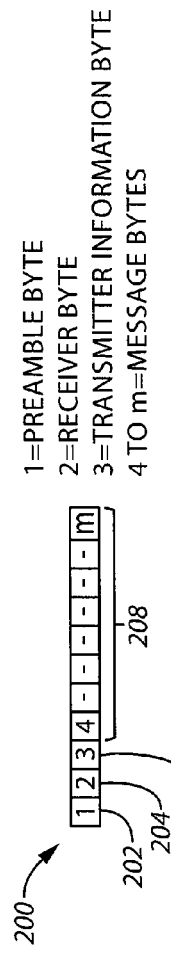
FIG. 2 comprises one example of a byte-map for use in a fault determination system according to various embodiments of the present invention.

Referring now to FIG. 2, one example of a message format for messages transmitted according to the approaches described herein is described. A message or packet 200 includes a preamble byte 202, a receiver information byte 204, a transmitter information byte 206, and 4 to m message bytes 208 where m is an integer greater than 4. In one approach, each transmitter within the system (e.g., transmitters 106, 108, 110, 112, 114, or 116 of FIG. 1) has a uniquely identifiable message byte (e.g., some unique pattern of binary ones and zeros) that is known to the receiver and that uniquely identifies a transmitter (e.g., the receiver 118 of FIG. 1). All information in the message or packet 200 is included in the data stream that is transmitted to the receiver.

To detect an error or fault, in one approach, the receiver compares the data received from the transmitter against pre-assigned data that it has stored regarding each transmitter. In the case of a mismatch between the received data and the expected data, a fault is potentially detected. The non-reception at the receiver of an expected message or packet expected to be sent from the transmitter may also indicate the existence of a fault in the form of open circuit in the network.

For transmissions across the network, various approaches may be used to ensure signal integrity (e.g., to ensure signals sent by multiple transmitters do not interfere with each other). In any approach used, the modem of each transmitter monitors the wire via a "carrier detect" approach that detects if there are any modulated signals on the wire, and waits to send its signal until there is no signal on the wire. Therefore, at any one moment, only one transmitter is allowed to send signals. In one approach, multiple transmitters send signals without the control of the receiver. To ensure signal integrity, a random pause duration is inserted after each signal transmission. Each transmitter has an equal chance to send a signal to the receiver and, therefore, each wire segment (e.g., each branch of the network) is monitored at the same priority with an equal chance of detecting errors compared with any other electrical branch.

In another approach that may be used to achieve signal arbitration, only a transmitter that is ordered by the receiver is allowed to send a signal. In other words, the receiver is the master of this single-master and multiple-slave protocol. The receiver sends a message or packet (e.g., a command) to a transmitter, for example, the message of FIG. 2. After the transmitter receives the message or packet from the receiver, this message is copied and sent back to the receiver. The comparison of the received message at the receiver against the sent message determines if there is an error in the signal, which in turn indicates that a fault exists in the wire segment between the receiver and the commanded transmitter. In some approaches and as described elsewhere herein, an error is detected if no return message is detected by the receiver (e.g., within a predetermined amount of time), indicating possible disconnected, open circuit.

Figure 3:
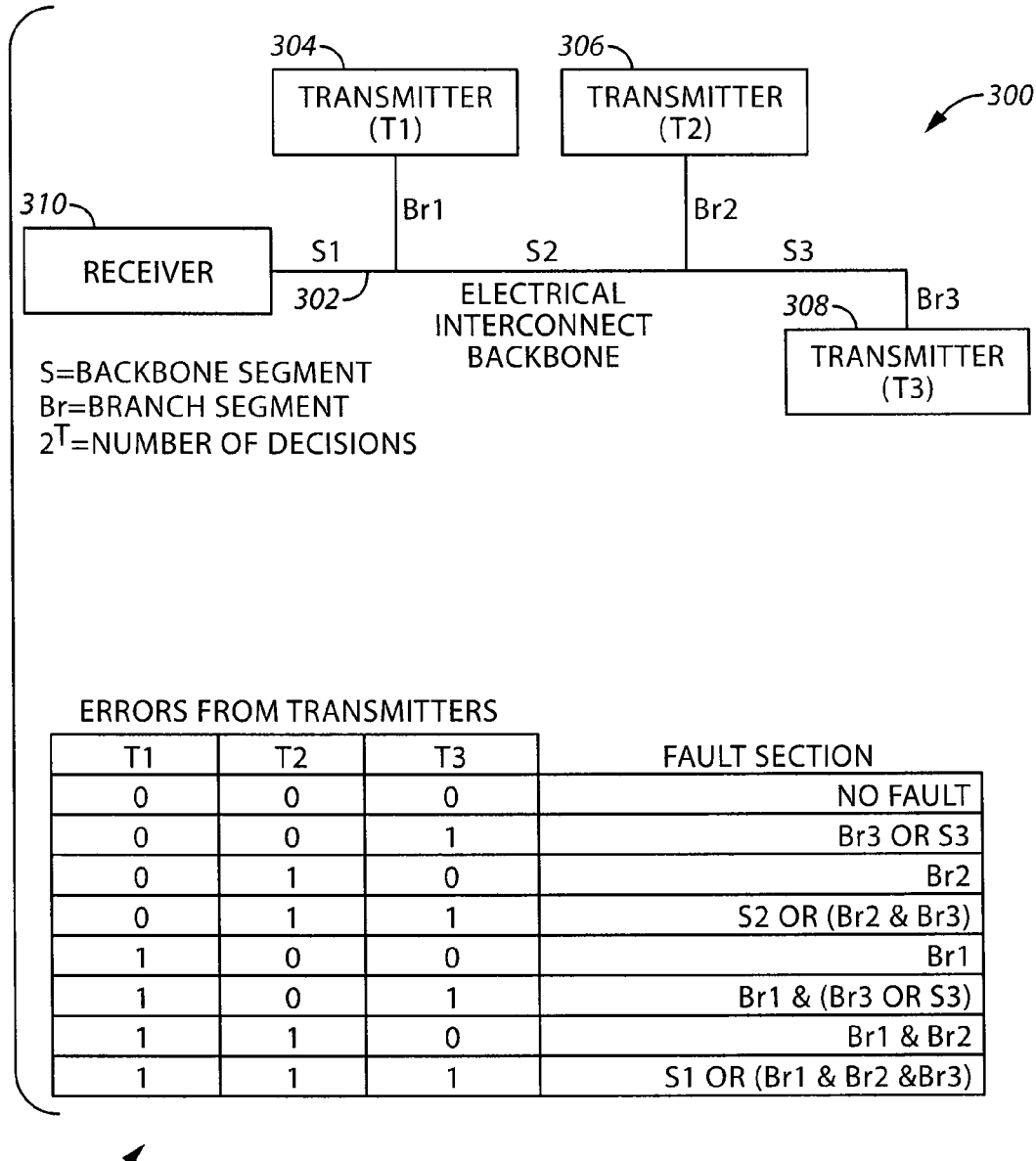
FIG. 3 comprises a block diagram and fault determination table illustrating one approach for fault determination according to various embodiments of the present invention.

Referring now to FIG. 3, one example of using these approaches to detect an error or fault in a network 300 is described. In this example, an electrical backbone 302 is coupled to transmitters 304, 306 and 308 and a receiver 310. The network 300 is divided into segments S1, S2 and S3 and branches Br1, Br2 and Br3. It will be appreciated that the system of FIG. 3 can be disposed at any location such as within a vehicle (e.g., car, truck, aircraft, or ship), within an appliance, or within a building. Further, the system of FIG. 3 can be disposed across multiple locations such as in various types of networking arrangements or configurations.

A table 312 is stored in a memory at the receiver and used to determine the possible location or locations of electrical faults within the network 300. For example, using the techniques described herein, it is determined if a particular error exists in one of the branches associated with a particular transmitter. For example, the mismatch of expected data from the transmitter 304 versus expected data, while there is no mismatch from the transmitters 306 and 308, may indicate that a fault exists in branch Br1.

To take a few examples and utilizing the table 312, if no errors are determined for transmitters 304, 306 and 308, no fault exists in the network. In another example, if no errors are detected at transmitters 304 and 308, but an error is detected at transmitter 306 then a fault may exist at segment S2 and/or both branches Br2 and Br3. It will be appreciated that the table 312 may be any type of data structure and is also not limited to the format shown in FIG. 3. Moreover, the examples shown in table 312 may vary depending upon the placement of the transmitters and the receiver and the exact configuration of the network or other circumstances.

Figure 4:
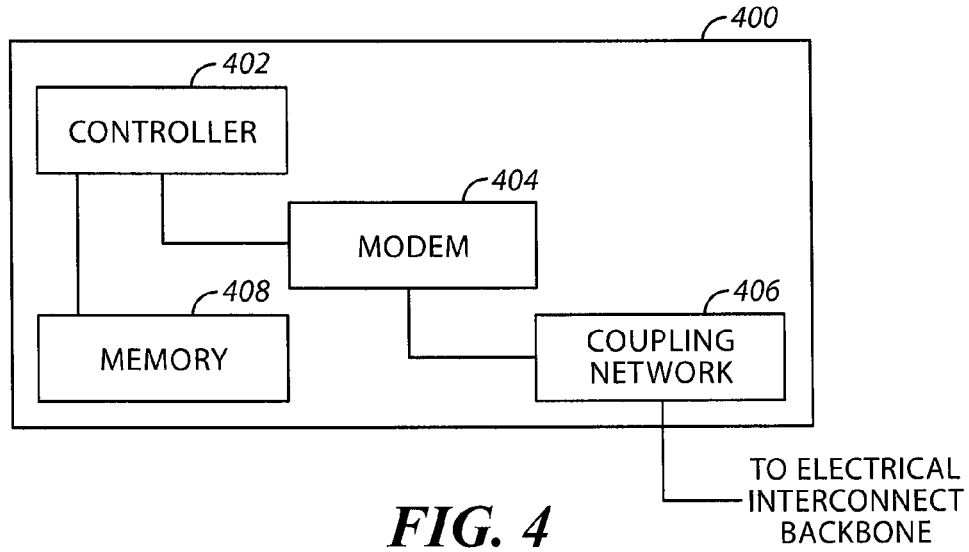
FIG. 4 comprises a block diagram of a fault determination apparatus according to various embodiments of the present invention.

Referring now to FIG. 4, one example of a transmitter or receiver 400 is described. The device 400 can be configured to operate as either a transmitter or receiver and includes a controller 402, a modem 404, a coupling network 406, and a memory 408.

If used as a transmitter, the controller 402 may form messages (e.g., packets) to send to a receiver via the modem 404 and coupling network 406. The modem 404 forms signals according to appropriate voltage levels or protocols and the coupling network 406 provides appropriate buffering and/or filtering capabilities that protect the modem 404 and controller 402 from electrical hazards (e.g., overvoltage conditions) present on the backbone and, at the same time, effectively inject the modulated signals into the backbone.

If used as a receiver, the coupling network 406 filters in only the modulated signal from the backbone and the modem 404 demodulates the signal into digital data and sends it to the controller 402. As a receiver, the device 400 may store in the memory 408 a table as has been described above with respect to FIG. 3. The controller 402 then may perform an analysis to determine the potential location or locations of faults within a particular network. Further, the controller 402 may be coupled to a port, which communicates with external devices to indicate to a user the presence and potential locations of faults. Further, the controller 402, modem 404, and/or coupling network 406 may be coupled to an external power supply.

Figure 5:
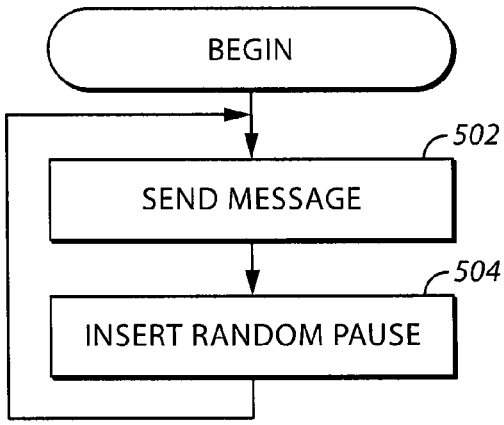
FIG. 5 comprises a flow chart of one approach for determining faults according to various embodiments of the present invention.

Referring now to FIG. 5, one example of a transmission arbitration protocol is described. At step 502, a message or packet is sent from a transmitter. For example, the message may be in the format as indicated in FIG. 2. At step 504, after the message is sent, a random pause duration is inserted after the message. Then, the same message is sent again, and this process continues, and to take one example, the receiver compares the received message to the expected message and determines that a fault exists if there is a mismatch. When a mismatch exists, a potential fault may exist in the portion of the network associated with the transmitter that sent the message.

Figure 6:
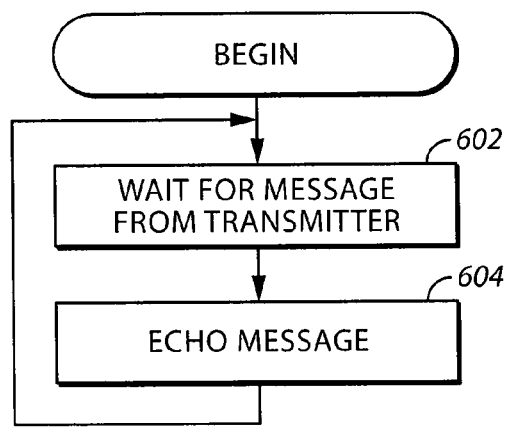
FIG. 6 comprises a flow chart of one approach for determining faults according to various embodiments of the present invention.

Referring now to FIG. 6, another example of a transmission arbitration protocol is described. At step 602, a transmitter waits to receive a message from a receiver. At step 604, after receiving a message the transmitter echoes the same message back to the receiver. Then, it waits for another command from the receiver. In the meantime, if the receiver never receives an echoed message back (e.g., after waiting for a predetermined time period) or the message returned to the receiver is in error (as would be indicated by a comparison of the received message with the expected message), then a fault (including open circuit) is indicated to exist.

Figure 7A:
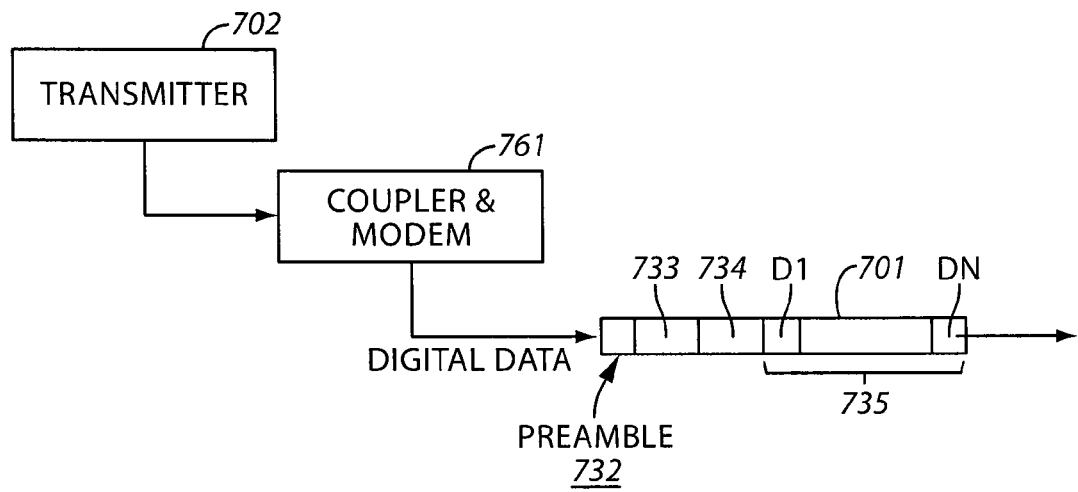
FIGS. 7a and 7b comprise a block diagram and a flow chart of one approach for determining electrical faults according to various embodiments of the present invention.
Figure 7A:
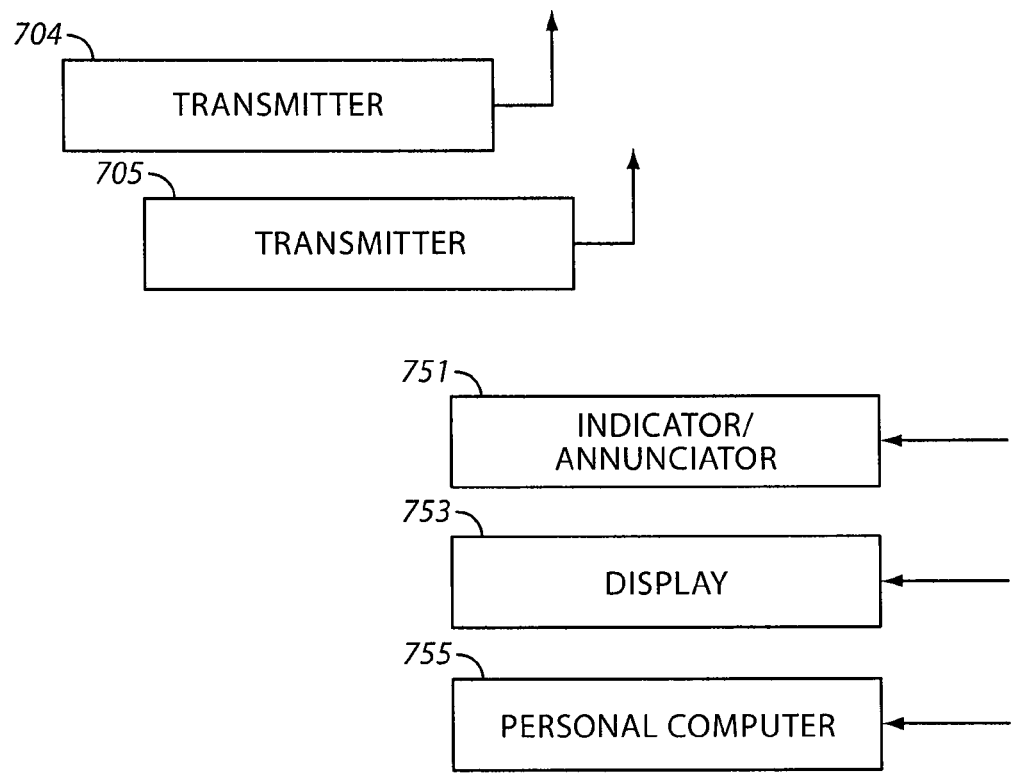
Figure 7B:
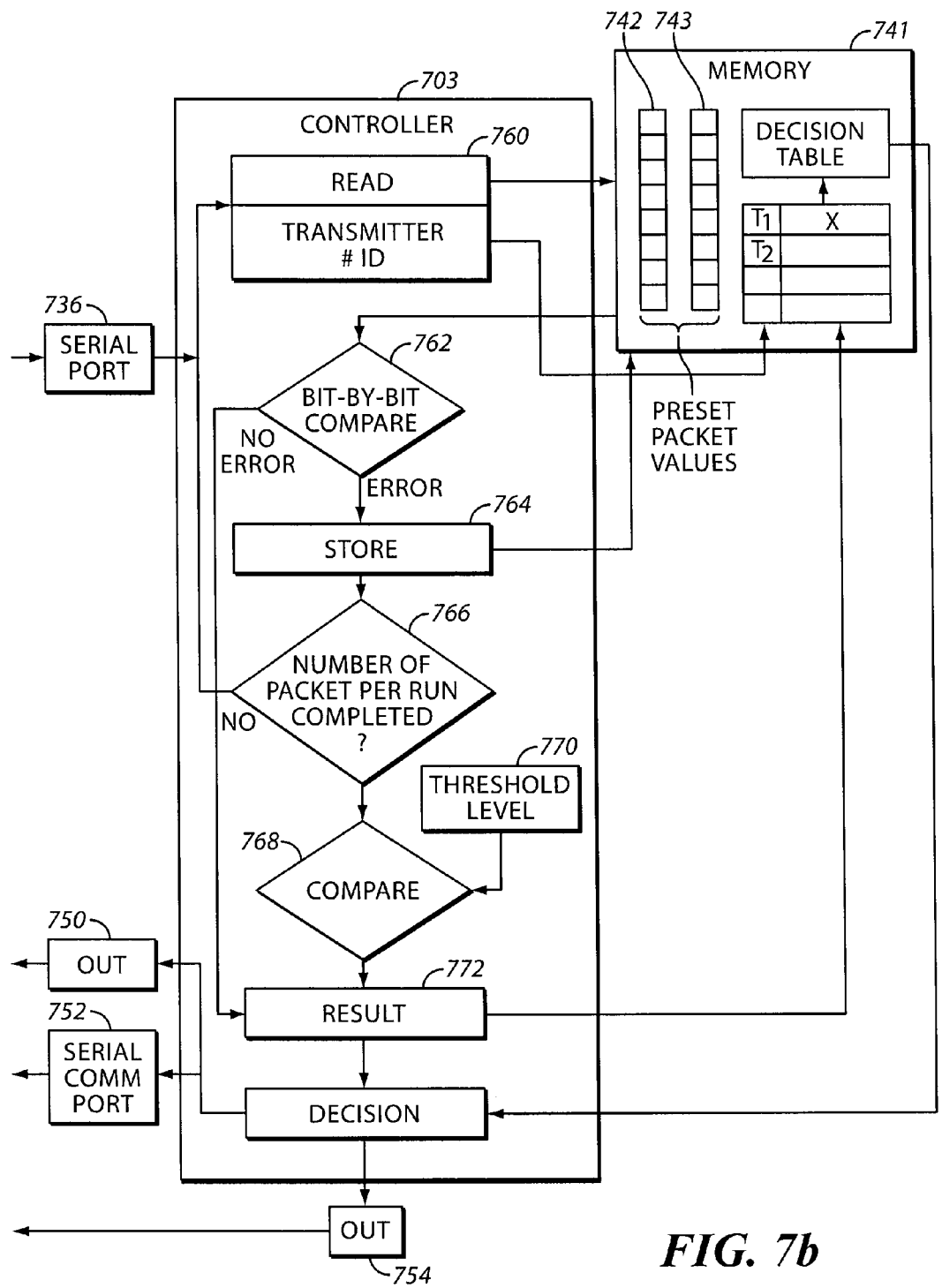

Referring now to FIG. 7, another example of approaches for fault determination is described. As shown in FIG. 7, through a coupling network and modem 761, a packet 701 (having pre-set values) is sent from transmitters 702, 704, and 705 to a controller 703 of a receiver, and read through serial communication port 736 of the controller 703.

The packet 701 includes, for example, preamble byte 732, and a transmitter identification byte 733, and a packet number byte 734, followed by n data bytes 735, D1 through Dn. N may be any integer value. In one example, n=24 and, consequently, 24 bytes of data are used. The rate of the data transmission, or bit rate, can become any speed or any modulation scheme suitable for the modem. In the some examples, a 2400 bps power line modem is used that provides approximately 130 kHz of Frequency Shift Keying (FSK) modulation. However, other numbers of data bytes may be used along with other bit rates and other modulation schemes. In some examples, a longer packet with slower bit rate with a modulation scheme may have better chance of intermittent fault detection than a shorter packet with higher bit rate with another modulation scheme.

The controller 703 of the receiver, after detecting the preamble byte 732, followed by identification byte 733, then reads the rest of the bytes (step 760) one at a time and store the packet into internal memory space 741. In another part of the memory 741, the packet 701 is stored as a packet 742 and is used for a comparison with an expected (and previously stored) packet 743. The expected packet 743 includes the expected values of information for the packet 742. The packet information stored in memory can be compared against each of the transmitters.

The controller 703 at step 762 reads the stored packets 742 and 743 and makes a bit-by-bit comparison of all n data bytes against the pre-set values of the n data bytes between the packets 742 and 743. The first analysis is to decide which transmitter sent the packet and the subsequent analysis result for packet mismatch is stored and associated with the transmitter. If the two packets are the same, then the result of no error is registered for the transmitter. Then, with for example, the decision table of FIG. 3, a fault detection and location decision is made and displayed 753 or uploaded to an upper level computer 755. Then, the next packet sent from a transmitter is read at step 762.

At step 764, the error details (including the identity of the transmitter that sent the packet) may be stored. At step 766 it is determined if an adequate number of packets has been received in order to determine whether an alarm should be given a user. If the answer at step 766 is negative, control returns to step 760. If the answer is affirmative, execution continues at step 768 where a comparison is made with a threshold 770. If the number of erred packets exceeds the threshold, a result 772 is formed as a fault (e.g., "1") or no-fault (e.g., "0") result of a particular transmitter as in the table of FIG. 3. The final decision on fault determination using the table (stored in memory) is made and communicated to one or more of a port 750 (for display on an enunciator 751), a communication port 752 (for presentation on a display 753) and/or port 754 (for display on a personal computer 755). Depending upon the type of display, graphical images may be formed to be displayed on some or all of the mentioned external devices.

As described herein, a pause may be inserted between transmitted packets. In one example, the pause between two consecutive packets, in a system using a microcontroller of 8-bits and 20 MHz speed, is about 100 milliseconds. The pause time is selected so as to be sufficient for processing to occur. For example, the pause duration may be selected to allow for the fault determination process to finish and also for error messages to be sent to external devices (e.g., the enunciator 751, the display 753, and/or the personal computer 755). The pause duration can also include time to allow processing to occur for a given number of packets, for example, 1000 packets.

The threshold level of the rate of error that initiates the fault (e.g., "1") or no-fault (e.g., "0") can be any predetermined value or, alternatively, be determined after a run of the system under clean electrical wire status. Further, the threshold can be automatically determined using the error rate by comparing the error rates during actual/normal operating status and those of actual intermittent fault status. Before deploying the above-mentioned approaches, a test run may be executed in a staged intermittent fault condition that sets the threshold level for a fault or no-fault boundary, and thus increases the detection probability while at the same time decreasing false alarm and nuisance readings.

Various error rates can be determined. For example, a first error type that can be calculated is a Net Packet Error Rate (NPER), which is the percentage of packets that contained errors out of the total number of received packets. In the NPER case, the lost packets by the error in identification byte(s) are ignored.

Alternatively, a Total Packet Error Rate (TPER), can be calculated. This rate is the percentage of the number of packets received with error out of the total number packets sent.

In another example, a Net Byte Error Rate (NBER) can be calculated. The NBER is the percentage of the number of packets received with just 1 data byte error caused by 1 or 2 bit errors in the byte out of the received packets with no error. The NBER focuses, unlike NPER or TPER, on very short disruptions. Very short disruptions in time rooted from an intermittent fault may cause error in a bit or two in a byte data, not across the data bytes.

Yet another alternative error rate that can be determined is the Total Byte Error Rate (TBER), which is the percentage of the number of packets received with 1 data byte error caused by 1 or 2 bit errors in the byte out of the total number of packets sent. The TBER ignores any disruptions which are long enough to cause errors in multiple data bytes. This rate does not include or consider long disruptions possibly caused by normal switching operations and, as such, could reduce the number of false alarms.

Figure 8:
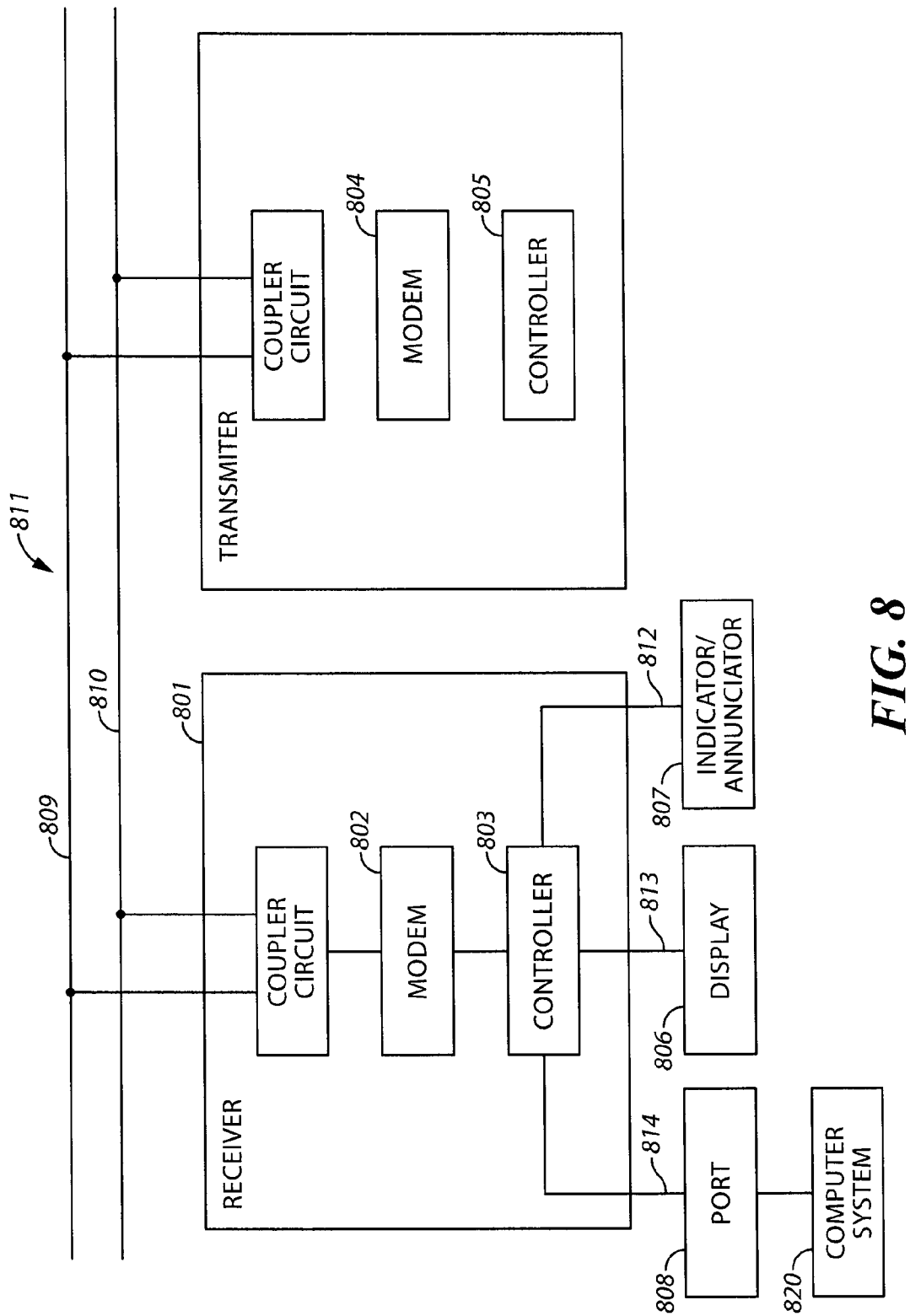
FIG. 8 comprises a block diagram of a transmitter and receiver according to various embodiments of the present invention.

Referring now to FIG. 8, a receiver 801 receives packets over electrical wires 810 and 811 that are transmitted by a transmitter 802. If the electrical wire carries DC current, then one of the wires 810 or 811 can be a ground wire. In the example of FIG. 8, both the receiver 801 and the transmitter 802 have the same functional structure and includes a modem 802 or 804 and a controller 803 or 805. The receiver 801 includes additional interface outputs or ports 812, 813 and 814. The output 813 is connected to an indicator/enunciator 807 to send an alarm when an intermittent fault is detected. This may be in the form of blinking light (e.g., light emitting diode (LED))and/or audible indication. The port 813 is used to display the alarm condition on a display 806 (e.g., a liquid crystal display (LCD)) with texts and graphics. The output 814 is further used to send the alarm condition to a computer system 820 via serial communication port 808 for displaying on a computer screen or for further analysis of the alarm condition data. The errors and error rates discussed herein can be displayed according to any of the display approaches described herein.

The transmitter 802 includes the modem 804 and the controller 805. The controller 805 is a microcontroller or microprocessor which includes computing code, controls digital logic, and sends bytes of digital data (e.g., packets). The computing code manages the number of packets sent and how often the packets are sent.

Figure 9:
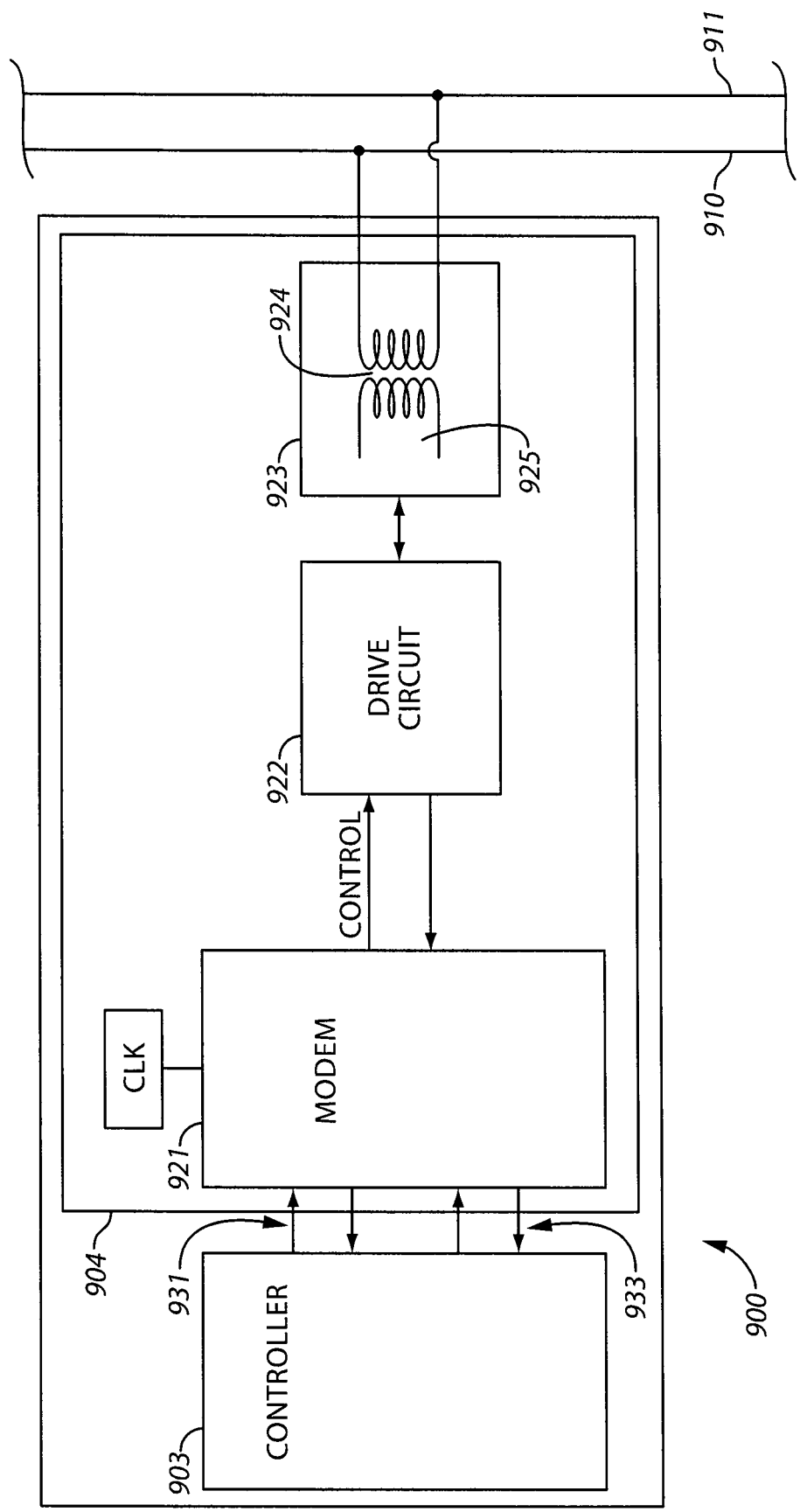
FIG. 9 comprises a block diagram of a controller module (e.g., a transmitter or receiver) according to various embodiments of the present invention.

Referring now to FIG. 9, one example of a transmitter 900 is described. A modem 921 in the transmitter 900 receives the serially transmitted digital data stream from a controller 903, converts the digital data to analog data, and modulates the analog data in FSK (Frequency Shift Keying) scheme (in which digital logic 1 is coded to analog signal of a certain frequency and digital logic 0 is to another frequency). The modulated signal is amplified by an amplifier 922 and sent through a coupler 923, which sends the modulated signals and blocks all other signals outside the frequency band, to the electrical wires 910 and 911.

The modem 921 may be any commercially available modem chip. The modem 921 may include a filter that band passes only the frequency band used in the particular FSK scheme that is employed. The modem 921 has four control and data communication lines with the controller 903. These include RX control 930 for controlling the reception of digital data, TX control 931 for controlling the transmission of digital data, carrier detect (CD) control 932 for indicating to the controller 903 if and when the modem 922 receives a modulated signal from an electrical wire, and RX/TX control 933 for indicating if a digital signal has been received and is to be transmitted.

A modulated signal automatically is transmitted from the modem 921 and amplified by the amplifier circuit 922. The amplified modulated signal then is presented to the electrical wires via a coupler 923, which passes the signals of the frequency band and blocks all other signals. The coupler 923, in one example, is a transformer coil 924 with filtering capacitors 925 and 926. In one approach, the structure of the receiver is identical (or nearly identical with the receiver having ports to communicate with external devices) with the structure of the transmitter 900.

Various transmission protocols may be used. For example, a byte of any data can be sent from the receiver to indicate to the transmitter to send data.

A packet may be sent to the receiver with various bytes of data. For example, a preamble byte may be included. The next byte is sent to identify the transmitter and the receiver. To take one example, if the identification byte is a preset data value such as a byte data of 10110011, then the receiver checks if the received identification byte is 10110011. If the received identification byte is the same as the preset data, then the receiver is now ready to receive the data stream that follows. One or more bytes can be used for identification purposes.

As mentioned, in one example, the group of data bytes including the preamble, identification, and actual data form a packet. In one approach, one packet is transmitted from a transmitter and reception of the same one packet made by a receiver. In one approach, the transmitter transmits the same one packet repeatedly, with a pause between two packets, until, for example, a set number of packets are sent (e.g., 956 packets). Then, packet transmission resumes. Under an intermittent fault condition, the preamble byte may be noised out, or the identification byte may be contaminated, then the receiver ignores the packet with the contaminated identification byte since the packet is interpreted as not meant to be sent to the receiver. In this case, one packet is lost and a packet error exists.

Figure 10:
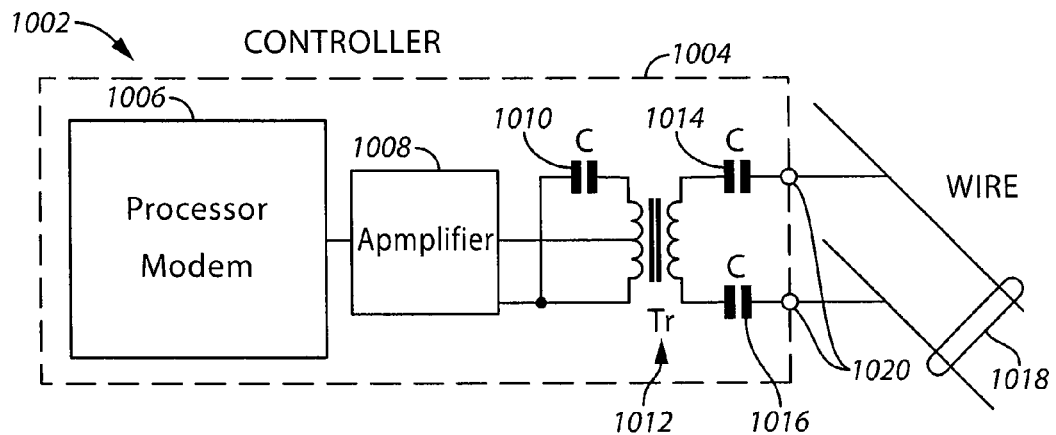
FIG. 10 comprises a diagram of a controller module (e.g., a transmitter or receiver) being coupled to a transmission line according to various embodiments of the present invention.

Referring now to FIG. 10, a controller (e.g., a transmitter or receiver) 1002 that is coupled to an electrical network is described. The controller 1002 includes a housing 1004 that encloses various electrical components. These components include a processor and modem 1006, an amplifier 1008, a first capacitor 1010, a transformer 1012, a second capacitor 1014, and a third capacitor 1016. The controller 1002 is connected to electrical wires 1018 at connection points 1020. The housing 1004 may be constructed of metal, plastic, or any suitable material or combination of materials. The modem 1006 performs various processing functions as described elsewhere herein. And, as used herein, the terms wire or wires indicate any type of electrically or magnetically conductive pathway.

The capacitors 1010, 1014, and 1016 (along with optional protective elements not shown in this example) protect the system from high voltage spikes, short circuit conditions, discharging elements, and adapt/convert the carrier signal (being of low-amplitude high-frequency) for transmission to the electrical system or network. These elements also convert signals received from the network. The network, in many examples, carries a much lower frequency, high amplitude power signal that needs to be filtered out so that only the modulated signal can be accepted, for use by the controller module.

The transformer 1012 includes inductive primary and secondary windings and provides multiple functions for the system. For example, the transformer 1012 provides isolation of the controller module and amplification circuitry from the wires 1018; injection of the carrier signal on the wires 1018; extraction of the carrier signal from the wires 1018; filtering of the high-amplitude low-frequency signal of the wires 1018; and the filtering of the harmonics of the carrier signal, to name a few examples.

The primary windings of the transformer 1012 (with a capacitor 1010 connected in parallel to the windings) form a band-pass filter. The inductances of the primary windings and the capacitance of the parallel capacitor 1010 determine a resonance frequency, which is set to the frequency of the carrier signal. The secondary windings of the transformer 1012, along with a series capacitor 1020, form a high-pass filter. This high-pass filter is coupled to or includes two terminals 1020, which directly connect to wires 1018 of the electrical system or network to allow high frequency carrier signals received to pass to and from the wires 1018 while blocking the low frequency high voltage signal from the wires 1018.

Since the two filters (band-pass and low-pass) are positioned inside (i.e., disposed substantially entirely within or entirely within the housing 1004) the controller module 1002, the controller module 1002 is, in this example, permanently connected via the two terminals 1020 to the wires 1018. In one example, multiple controller modules are used and permanently coupled to the wires 1018.

Figure 11:
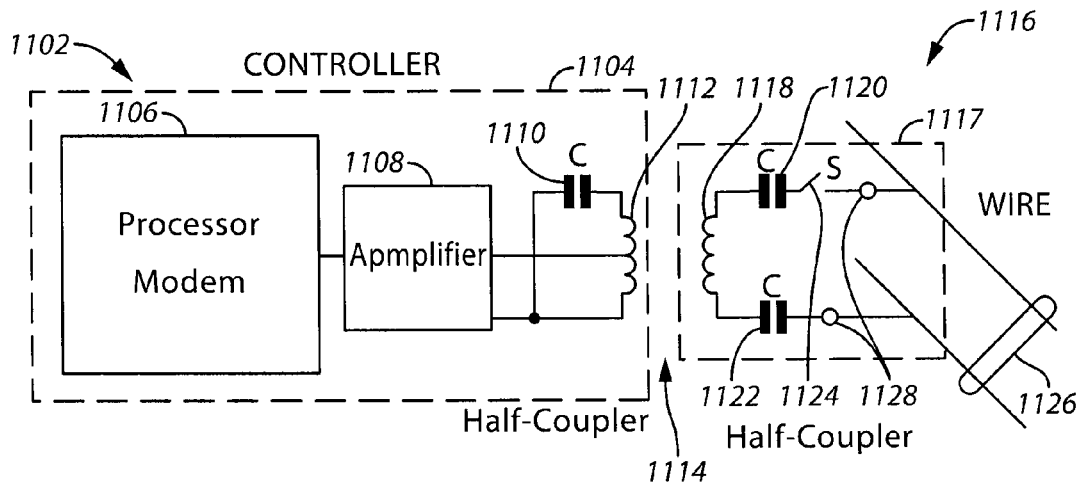
FIG. 11 comprises a diagram of another example of a controller module (e.g., a transmitter or receiver) being coupled to a electrical network according to various embodiments of the present invention.

Referring now to FIG. 11, another example of a transmitter/receiver connection to an electrical network is described. A first half-coupler module 1102 includes a housing 1104 that encloses various components. These components include a processor and modem 1106, an amplifier 1108, a first capacitor 1110, and a first winding 1112 of a transformer 1014. A second half-coupler module 1116 includes a second winding 1118 of the transformer 1114, a second capacitor 1120, a third capacitor 1122, and a switch 1124. The second half-coupler module 1116 is connected to electrical wires 1126 at connection points 1128. The components are housed in a second housing 1117. The second housing 1117 may be constructed from metal, plastic, or any other suitable material or combination of materials.

As shown in the example of FIG. 11, the transformer windings 1112 and 1118 are placed within two separate housing units. Alternatively, two separate circuit boards (or other separate contiguous circuit forming arrangements) can be used. The primary winding is disposed at or within the half-coupler 1102 and the secondary winding is disposed at or within the half-coupler 1116 so that one half-coupler forms one half of the line coupler circuit described above and the other arrangement forms the other half of the line coupler circuit.

The switch 1120 can be inserted in the wire-side half-coupler, as illustrated in FIG. 11, so that the half-coupler 1116 can be disconnected from the wire when fault determination functionality is not needed. One benefit of using a switch 1124 in the wire-side half-coupler 1116 is that when the switch 1124 is in the off (i.e., deactivated) position, no power consumption occurs.

The half-coupler 1102 includes one winding and a parallel capacitor, and these components are located entirely or substantially entirely within the housing 1104 and provide band-pass filtering. The half-coupler 1102 does not have output terminals for connection. Instead, its winding becomes a signal exchange point in the system.

As mentioned when aligned and magnetically linked together, the two half-couplers 1102 and 1116 form a coupler circuit and works as a complete coupler. By the separating the coupler into a wire-side half-coupler 1116 and an in-controller half-coupler 1102, the control module (whether used as a transmitter or receiver) now can become portable and is able to wirelessly exchange carrier signals over the wire 1126 via the wire-side half-coupler 1120.

The windings of the half-couplers 1102 and 1120 can be wound around air core. In another approach, a high permeability split-core (to strengthen the magnetic linkage and provide efficient magnetic induction of signal of the windings) can be used.

Figure 12:
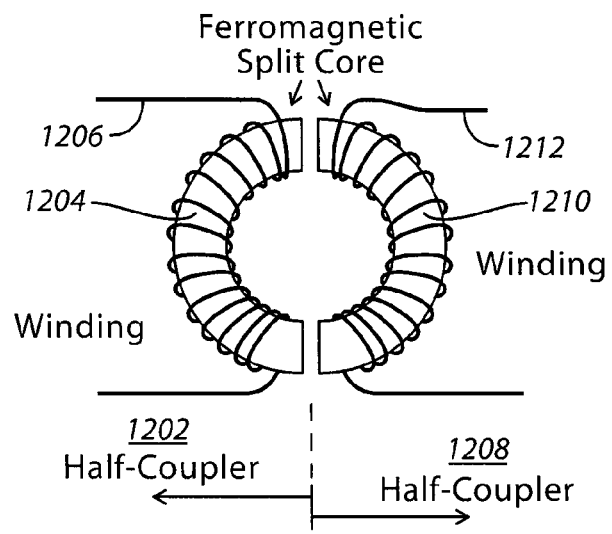
FIG. 12 comprises a diagram of another example of controller module (e.g., a transmitter or receiver) being coupled to an electrical network according to various embodiments of the present invention.

Referring now to FIG. 12, an example of a magnetic coupling arrangement between a controller module and an electrical network is described. A first half-coupler 1202 includes a first ferromagnetic core 1204 and first winding 1206 wound there around. A second half-coupler 1208 includes a second ferromagnetic core 1210 and second winding 1212 wound there around. Various core materials and shapes can be used for optimal signal exchange. As an example, a ring-shape split core of ferromagnetic material can be used with windings at both sides of the split-core as illustrated in FIG. 12.

Figure 13:
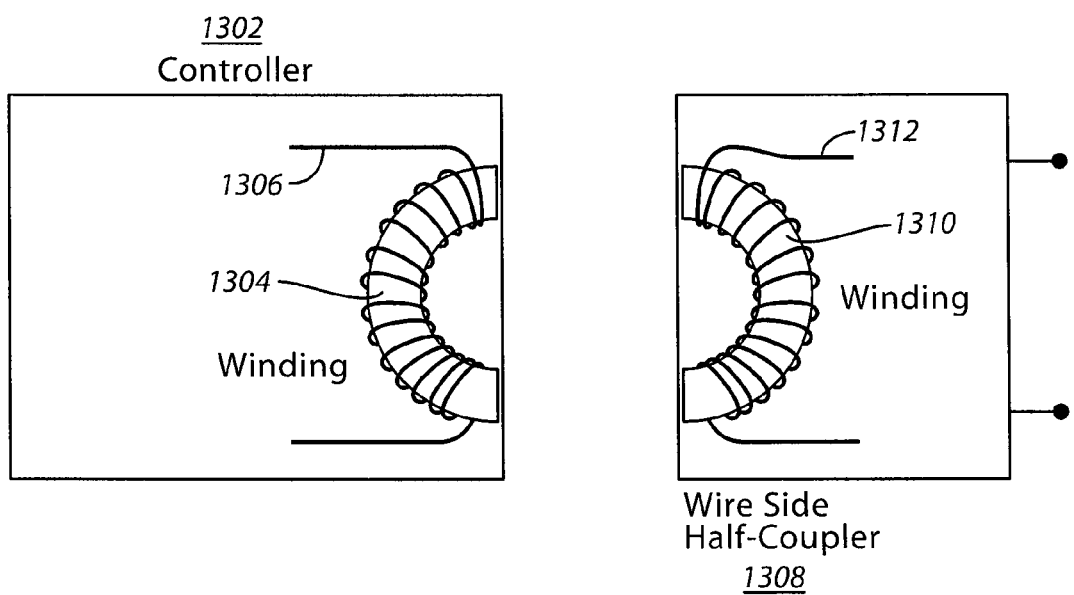
FIG. 13 comprises a diagram of a magnetic coupling arrangement according to various embodiments of the present invention.

Referring now to FIG. 13, an example of a magnetic coupling arrangement is described. A first half-coupler 1302 includes a first ferromagnetic core 1304 and first winding 1306 wound there around. A second half-coupler 1308 includes a second ferromagnetic core 1310 and second winding 1312 wound there around.

One side or portion of the split-core (with surrounding winding) is disposed within the wire-side half-coupler, and the other side of split-core and winding can be disposed within the in-controller half-coupler as illustrated in FIG. 13. During signal transmission or reception, the two half-couplers are placed as close as possible. The split core is aligned such that magnetic leakage is minimized for maximum magnetic induction and, thereby, the signal exchange occurring via the half-couplers remains completely or substantially undistorted and/or not attenuated. In one example, the two half-controllers are placed 0.04 inches apart. Other placements are possible.

Figure 14:
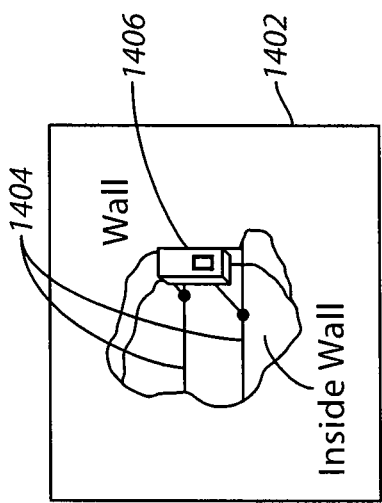
FIG. 14 comprises a diagram of a controller module (e.g., a transmitter or receiver) placed in a wall according to various embodiments of the present invention.

Referring now to FIG. 14, one example of the physical placement of a controller module (e.g., a transmitter or receiver) is described. A wall 1402 covers wires 1404 which are part of an electrical network that conducts electrical power. A controller module 1406 is magnetically or otherwise coupled to the wires 1404 and hence the electrical network. Any of the techniques described herein can be used to perform the coupling.

Figure 15:
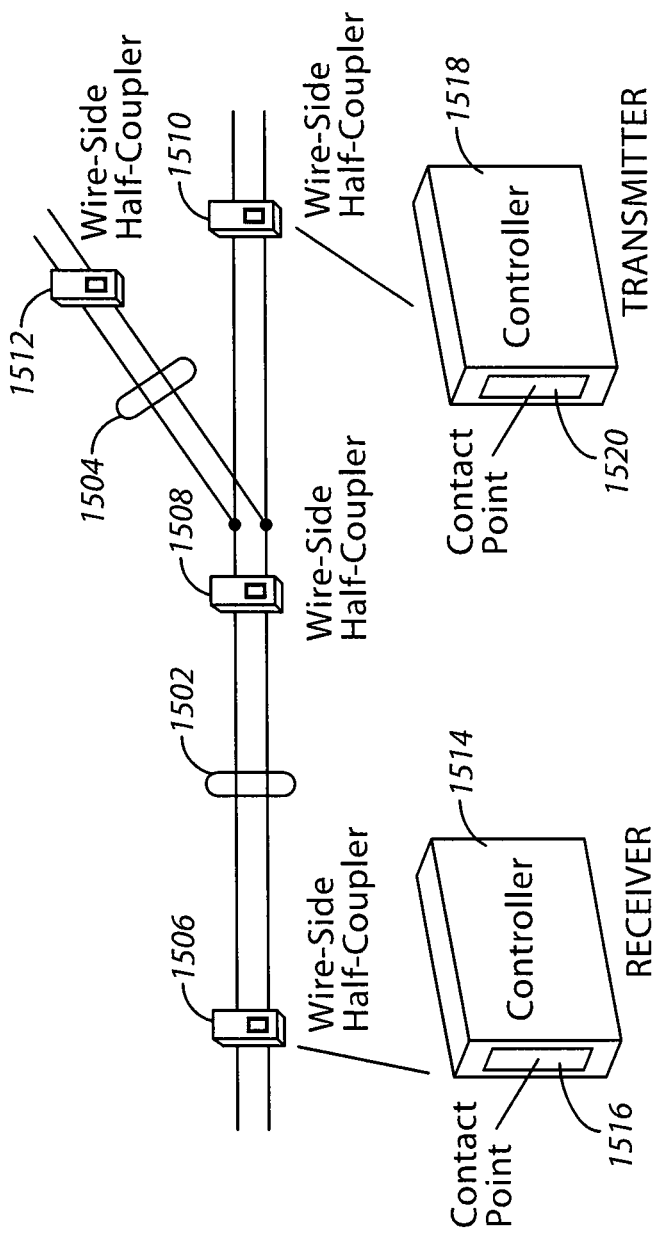
FIG. 15 comprises a diagram of a network including controller modules (e.g., transmitters and/or receivers) according to various embodiments of the present invention.

Referring now to FIG. 15, one example of the placement of controller modules (e.g., transmitters and receivers) within an electrical network is described. A first electrical branch (e.g., wires) 1502 is coupled to a second electrical branch (e.g., wires) 1504. The first electrical branch 1502 is coupled to wire-side half-couplers 1506, 1508, and 1510 as described herein. The second electrical branch 1504 is coupled to wire-side half-coupler 1512. As shown, wire-side half-coupler 1506 is magnetically coupled to a receiver 1514. The receiver has a contact point 1516 where it is magnetically coupled to any wire-side half-coupler (e.g., wire-side half-coupler 1506). A controller 1518 includes a contact point 1520 where it is coupled to any other wire side half-coupler (e.g., wire side half coupler 1510).

Any of the wire-side half-couplers can be constructed according to various configurations and dimensions, and provide various connection types. For example, a wire-side half-coupler can be a bare circuit board (e.g., no housing) with the winding disposed around a half split-core.

This arrangement also includes a capacitor and a switch. In this case, the switch can be tied to two wires. In another example, the components of the wire-side half-coupler can be disposed within a housing. The housing may include a cover under which the components (e.g., the core and winding) are placed. The housing protects the components from environmental conditions or damage caused by bumping, vibrations, or the like. This wire-side half-coupler operates as a docking place station for a half-coupler controller module and the combination of both half-couplers provides carrier signal exchange to and from an electrical network. The housing can be manually connected to wires from its two terminals (as illustrated in FIG. 15), or it can be inserted to a standardized receptacle outlet of numerous types or any similar connection mechanism of power point or socket via appropriate connector mechanism attachment at the two terminals. As illustrated in FIG. 15, the wire-side half-couplers can be installed at various locations within the electrical network with their switch positions (if the half-coupler includes a switch) either on or off. The receivers and transmitters can also be moved between the wire-side half-couplers as needed or required.

The in-controller half-couplers 1514 or 1518 are disposed inside a housing in such a way that their windings and cores are placed at one end of the controller housing. Consequently, in docking with a wire-side half-coupler, the in-controller half-coupler is magnetically linked with the wire-side half-coupler. Multiple numbers of controllers can be permanently placed in a docked position for continuous operation of the system. Alternatively, a controller used as a receiver and docked permanently in a location, and a transmitter controller can be moved from one wire-side half coupler to another to check for the presence and location of intermittent electrical faults from various places in the network. In any of the examples described herein, either of the half-coupler modules can have single or multiple primary and secondary windings.

A transmitter controller module and its winding(s) may be coupled to multiple wire-side half-couplers. The wire-side half-couplers then inject signals into the electrical network. Thus, by using the portable and wireless carrier signal exchange mechanism described herein, only a single transmitter is needed to transmit carrier signals to multiple wire-side half-couplers positioned within its range. This single-transmitter controller and multiple wire-side half-coupler configuration can be implemented according to several different approaches.

In one example implementation, the transmitter controller indiscriminately broadcasts its carrier signal using a single frequency band as described herein to any wire-side half-coupler of a frequency selecting circuit such as a high-pass filtering apparatus. The signals are injected into the electrical network and any wire-side coupler (acting as a receiver) tuned to the same tuned frequency band receives the transmitted information through the wire-side half-coupler to which it is docked when the electrical system is operating correctly (i.e., no faults exist). This information is then communicated (via a magnetic coupling) to the receiver controller half-coupler. When any part of the electrical system is in an intermittent fault condition, one of the received data streams will indicate an error, but the receiver may not know the exact location of the fault condition since the data stream could be from any one or multiple wire-side couplers. This approach provides information concerning the general health of the electrical network and the general area where a fault condition exists.

In another approach of implementing the system architecture described herein, the transmitter controller selectively broadcasts its carrier signal of different frequency bands at different times so that only a single or a group of wire-side half-couplers tuned to the same frequency band can receive the carrier signal and, therefore, the carrier signal can be injected to the wire system through the selected wire-side half-coupler or couplers.

This second approach preferably employs modified half-couplers coupled to the examples discussed above. More specifically, the in-controller half-coupler (of both transmitter and receiver controllers) are able to selectively generate and receive different frequencies and each can be tuned to one or a group of wire-side half-couplers. The selective frequency filtering and generation can be achieved by deploying programmable variable inductors and capacitors that can be controlled by a microprocessor (or similar arrangement) or by placing multiple pairs of inductors and/or capacitors (or other active or inactive electrical components) of suitable values that can be manually selected by user to achieve the desired frequencies. In addition, each wire-side half-coupler is preferably configured to provide a band-pass filtering half-coupler, which can be tuned to any desired frequency band. Thus, because a given frequency is generated by the transmitter controller, only one specific wire-side half-coupler or a group of wire-side half-couplers are tuned, thereby allowing the exchange of carrier signals.

In the second approach, the transmitter sends a carrier signal of different frequency bands at different times (e.g., randomly, sequentially or according to other known approaches), to the wire-side half-couplers within the range of the transmitter. The signal is then injected into the electrical network. Receivers then selectively receive the carrier signal from a specific wire-side half-coupler or a group of wire-side half-couplers, which are used for the carrier signal injection to the wire system. With different wire-side half-couplers placed in predetermined locations in the wire system, this approach provides the location information of the wire-side half-coupler(s) and the location of intermittent faults in the wire system. Assigning a specific frequency to a single wire-side half-coupler or a group of wire-side half-couplers may increase the accuracy level of locating faults in the electrical system.

The present approaches detect intermittent faults, harbingers to permanent faults to come, in the line circuit existing between a transmitter and a receiver. A carrier signal is injected into the network and any disruption to the signal caused by the intermittent excursions of voltage and current in the network can be detected. The location or the resolution or accuracy of the location of the system can be obtained by identifying the wire segment where a transmitter and a receiver are installed to monitor the intermittent events. Multiple transmitters and receivers can be strategically installed to form zones of circuit, whether it be a single circuit or multiple, branched feeders from a circuit. Overhead lines, underground cables, and windings and coils can be considered wires in these approaches as far as they provide electricity to loads. Intermittent faults in any of these elements can consequently be determined.

Many of these approaches inject coded multiple carrier signals from multiple transmitters to one or more receivers, which act as a base station for detection and location of faults, in such a manner that faults in any zone made of a transmitter at one end and a receiver and the other end can be identified. Zones can be defined on the main circuit, feeders, and branches, series or parallel connected. In one example of these approaches, a receiver station at the main circuit is positioned close to the source and a transmitter is positioned at each feeder, near a branch-out point or a feeder-end point, or anywhere in between. If more accuracy is required, additional transmitters can be installed in the feeders. For winding machines, transformer windings can be treated as a "wire" since the carrier signal can be induced at the other side of the transformer if a signal is injected at one side. The internal winding faults, turn-to-turn for example, would disrupt the injected carrier signal and the induced, received carrier signal would contain errors and mismatches, indicating intermittent event and its location between the transmitter and the receiver, which is, in this case, is the transformer itself. The other winding machine type, motor, is a load. The noise from loads may also affect the carrier signal over the wire; therefore, the zone structure is able to determine the location of such noisy behavior of a motor load.

In wavelength-division multiplexing (WDM) optical networks, a network node consists of an optical switch and an electronic controller. The electronic controller manipulates the switch, and maintains information about the network topology and wavelength occupation. Network nodes are connected by network links (e.g., optical fibers) that carry a number of optical channels. These optical channels carry data. On the other hand, the electronic controllers communicate with each other using dedicated electronic or optical channels. The WDM multiples optical carrier signals on a single optical fiber by using different wavelengths of light to carry different signals, which enables multiple bidirectional communication over one strand of fiber.

In an optical network, faults include breaks or poor connections or sharp bends in an optical fiber, and their effect in data disruption propagates in the network links. Data disruption from a single fault can propagate throughout an entire optical network without revealing the accurate location of the source of the fault.

Intermittent and permanent fault conditions in optical network (e.g., breaks, poor connections, or sharp bends in an optical fiber to name a few examples) can be detected by the present approaches of signal injection, and the presence and location of fault can be found by the same way of pairing transmitters and receivers as discussed herein with respect to wired networks, with data mismatches in the pairs. The fault detection in fiber optic network utilized by the present approaches is described, using two example cases and under two different network situations: a general optical network and a WDM optical network. Other examples are possible.

Figure 16:
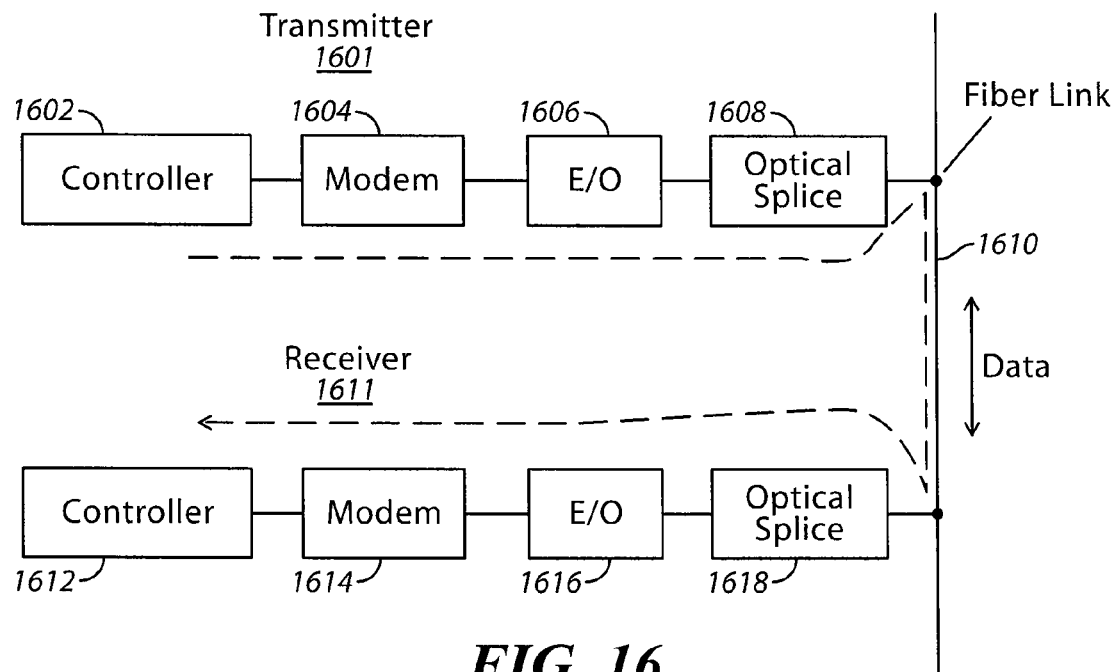
FIG. 16 comprises a diagram of an example of a transmitter and receiver as used in an optical network according to various embodiments of the present invention.

In optical networks that use general fiber links, where multiplexing may be or may not be employed, the transmitter controller sends data packet to a modem and the modem modulates the data into high frequency signal, whose wavelength is different from that (or those) of data transmission. For example, as illustrated in FIG. 16, a transmitter 1601 includes a first controller 1602, a first modem 1604, a first electrical-to-optical (E/O) interface 1606 and a first optical splice 1608. A fiber link 1610 connects the transmitter to a receiver. The receiver 1611 includes a second controller 1612, a second modem 1614, a second O/E interface 1616, and a second optical splice 1618. In this example, the different wavelength signal is then injected via the first E/O interface 1606 and through the first optical splice 1608 into an injection point of the fiber link 1610. At the reception point of the fiber link 1610, through the second optical splice 1618 from the fiber link 1610 and via the second O/E interface 1616, the signal arrives at the second modem 1614 and is there converted to data packets. At the receiver 1611, the data mismatch and error, caused by fiber faults and failures, are calculated for fault detection over the fiber link 1610 between the injection and reception points of the signal and sent to the second controller 1612. Multiple transmitters can be disposed at different points of the fiber optic network along with one or more receivers for the detection and location of fiber faults and failures. By injection and reception of signal with a wavelength that is different from the wavelengths used for carrying data on the fiber link, the present approaches can be utilized, in the same fashion as in wired network, to perform continuous monitoring of optical network without interrupting the flow of data.

Figure 17:
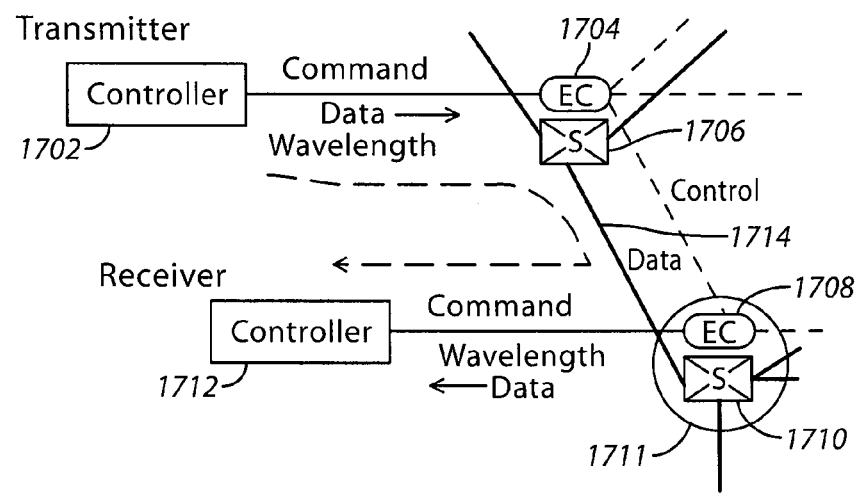
FIG. 17 comprises a diagram of another example of a transmitter and receiver as used in an optical network according to various embodiments of the present invention.

In a WDM optical network, another example of the present approaches can be used. Since the WDM allows multiple wavelength signals to be transmitted, instead of injecting a different wavelength signal from those assigned for data transmission, an unused wavelength signal can be used for fiber channel status monitoring by sending and receiving known sets of data packets between optical nodes. For example, as depicted in FIG. 17, a system includes a transmitter controller 1702, a first electronic controller 1704 and a first optical switch 1706 (together a first optical node 1701), a second electronic controller 1708 and a second optical switch 1710 (together a second optical node 1711), and a receiver controller 1712.

In this example, the transmitter controller 1702 as described herein, with established communication to the first electronic controller 1704 of the first optical node 1701, commands the first electronic controller 1706 to send data packets using an unused wavelength signal. The receiver controller 1712 of the present approaches, with a communication link to the second electronic controller 1708 of the second optical node 1711, commands the second electronic controller 1708 to receive the data packet transmitted using the unused wavelength signal, and receives the data packet. At the receiver controller 1712, the data mismatch and error caused by fiber faults and failures are calculated for fault detection over a fiber link 1714 between the nodes 1701 and 1711 that carry the additional, unused wavelength signal. Multiple transmitters can be disposed at different nodes of the WDM network along with one or more receivers in order to detect and locate fiber faults and failure of break, poor connection, and sharp bends in the entire optical network. By using a wavelength that is different from the wavelength used for carrying data on the WDM network, the present approaches can be utilized, in the same fashion as in wired network, to perform continuous monitoring for fiber link fault detection in WDM optical network without interrupting the flow of data.

Thus, approaches are provided to detect the presence and locations of faults within an existing electrical network or other type of network. The approaches utilize one or more transmitters to send signals (e.g., packets) to one or more receivers and based upon the signal received at the receiver, to determine the presence and location of electrical or other types of faults.

The coupling arrangements described herein can also be split into two half-couplers. By separating the coupler into, for example, a wire-side half-coupler and an in-controller half-coupler, the controller now can become portable and wirelessly exchange carrier signal with the electrical system or network via the wire-side half-coupler. The approaches described herein are easy and cost effective to use, do not rely upon the transmission of high voltage signals, can be implemented at any place within the electrical system, and are not susceptible to false results as have been obtained in previous approaches.

The approaches described herein apply to any type of wired communication including both data lines (e.g., data buses) and power lines. Further, the approaches can be applied to networks that are disposed in any location (e.g., vehicles, buildings, local area networks, wide area networks no mention a few examples).

Figure 18:
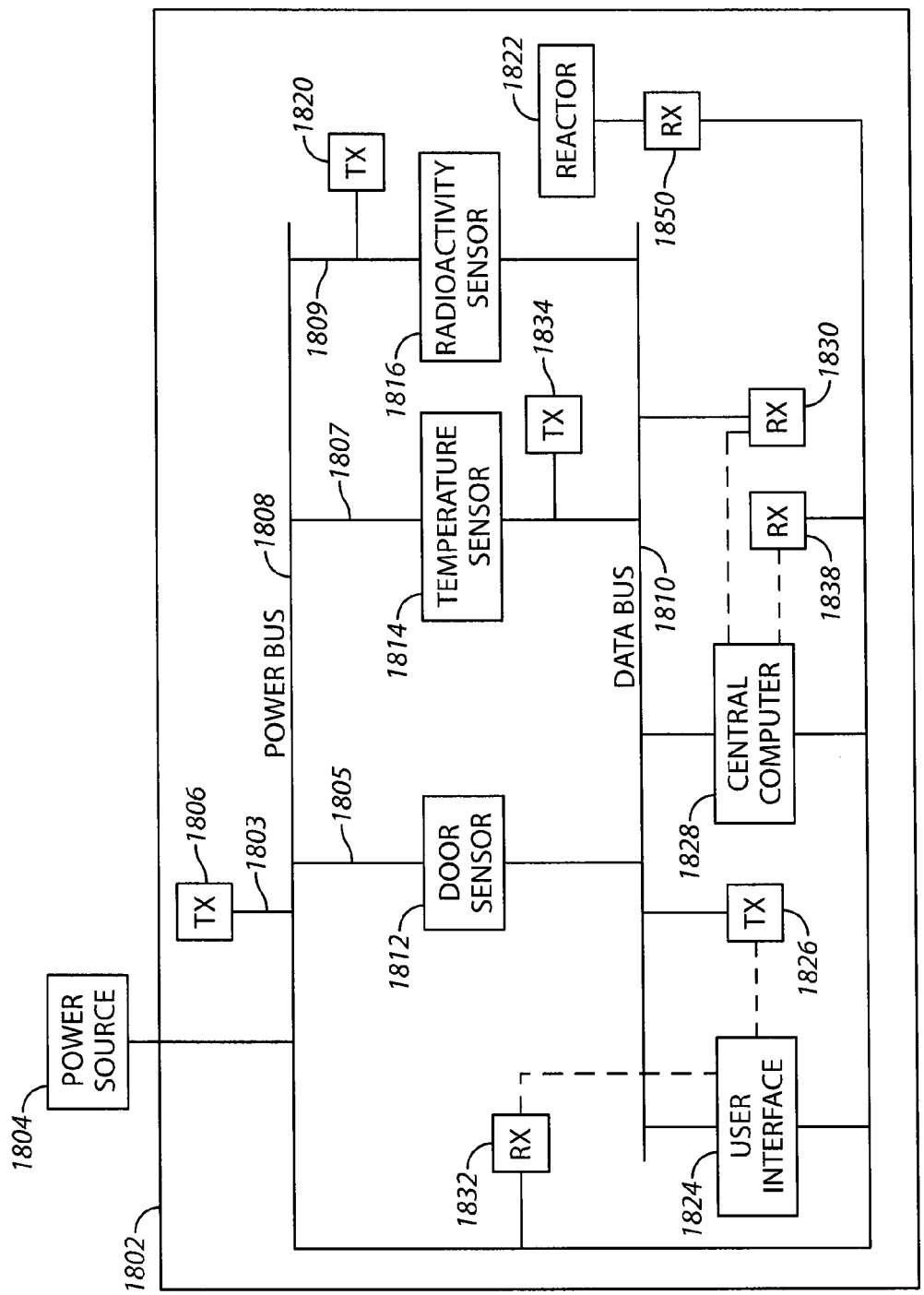
FIG. 18 comprises a block diagram of a network including fault determination devices according to various embodiments of the present invention.

Referring now to FIG. 18, one example of a system for detecting and/or locating faults in various types of networks is described. A building 1802 (such as a nuclear power plant, school, or business to mention a few examples) has various elements disposed therein. For instance, a power bus 1808 includes branches 1803, 1805, 1807, and 1809. The power bus 1808 is coupled to a power source 1804, a first transmitter 1806, a door sensor 1812, a temperature sensor 1814, a radioactivity sensor 1816, a second transmitter 1820, a first receiver 1832, a user interface 1824, and a central computer 1828. In this particular example, the building 1802 is a containment building and includes a nuclear reactor 1822. A data bus 1810 is coupled to the door sensor 1812, the temperature sensor 1814, the radioactivity sensor 1816, a third transmitter 1834, a fourth transmitter 1826, a second receiver 1830, the user interface 1824, and the central computer 1828.

In other examples, the network may be included in a vehicle (i.e., the building 1802 may be a vehicle). When the element 1802 is a vehicle, it may be any type vehicle such as an aircraft, boat, ship, or vehicle (car, truck, motorcycle, bicycle and so forth). Further, the element may be an appliance such as a generator or consumer appliance. Still further, the elements residing within the entity 1802 may in some examples be disposed outside element 1802 (e.g., when the elements are configured in a local area network or a wide area network to mention two examples). It will also be appreciated that the sensors used in these different configurations may change to suit the needs of the entity. For example, when the configuration of FIG. 18 is disposed in a vehicle, the sensors 1812, 1814, and 1816 may sense the interior temperature of the vehicle, whether a door is open, and tire pressure to mention a few examples.

The system of FIG. 18 allows communications to be exchanged between the different entities coupled to the data bus 1810. For example, the user interface 1824 may communicate with the central computer 1828. Various users may use communication devices (not shown) that also couple to the data bus and exchange information.

A power bus 1808 is any single or multiple conductors that conduct power to the various system elements. The power source 1804 is any type of power source such as an alternating current power source (e.g., a generator) or a direct current source (e.g., a battery). Other examples are possible.

The transmitters 1806 and 1820 may be any type of apparatus used to transmit a modulated signal to detect intermittent faults on the power bus. In one example, the transmitters 1806 and 1820 are the transmitters described with respect to FIG. 4 described elsewhere herein.

The door sensor 1812 is any type of sensing device that can determine whether a door is open or closed. The temperature sensor 1814 is any type of sensor (e.g., a thermometer) that can determine the air temperature of the building. The radioactivity sensor 1816 is any type of sensor that can determine the radioactivity levels of the building. As mentioned, it will be understood that the sensors 1812, 1814, and 1816 are examples only for a building that houses a nuclear reactor and that the type of sensor that is used may be changed to suit the building type. Further, it will be appreciated that when the system is integrated into a vehicle the type and function of the sensors will also likely be changed. The sensors may be attached to a building element (e.g., wall, beam, door, window, ceiling, to mention a few examples) so that they can sense a condition (e.g., temperature) or status (e.g., door open, door closed) in the building, associated with the building, or associated with a building element. When used in a vehicle, the sensors may be attached to the vehicle or vehicular element (e.g., on the door frame, in the interior), to detect various conditions (e.g., a door being open, or interior temperature).

The receiver 1832 may be any type of apparatus used to receive a modulated signal to detect faults. In one example, the receiver 1832 is a receiver as has been described with respect to FIG. 4 described elsewhere herein.

It will be appreciated that the various transmitters and receivers illustrated in FIG. 18 may be integrated into any of the other devices shown in FIG. 18. For example, some of the transmitters and/or receivers may be integrated with (i.e., included within the housing of) other devices such as the central computer 1828 or the user interface 1824. In one example, a receiver 1838 is integrated with the central computer 1828.

The user interface 1824 is any type of device used to present information to a user and/or receive user input. For example, the user interface 1824 may be a personal computer, laptop, cellular phone, personal digital assistant, or pager, to mention a few examples. Other examples of interfaces are possible. In the example of FIG. 18, when coupled with receivers such as 1832 on the power bus and 1826 on the data bus (indicated in dashed lines), the user interface 1824 may be used to display alarms to a user when an intermittent fault is detected at either or both of the buses. The interface 1824 may also be used to show the location of the fault to users. It will be appreciated that the format used to display information to the user may be changed and adjusted to suit the needs of the user and the system. The user interface 1824 (and/or the receivers) may be coupled to other systems by any type of wired (e.g., internet) or wireless connection.

The central computer or controller 1 828 is any type of processing device that is configured to receive and process information from the sensors and/or the user interface, and it may be coupled with the receivers such as the receiver 1830 for the data bus and the receiver 1838 for the power bus (indicated in dashed lines), and may receive information from one of the receivers indicating a fault and issue warnings to the users (e.g., issues alarm messages). The central computer 1828 may be additionally coupled to other systems by any type of wired (e.g., internet) or wireless connection. In a similar manner, receiver 1826 and/or 1832 may be coupled to other systems. The central computer 1828 or receivers 1830 or 1832 may be communicatively coupled to other networks or outside entities using either wired or wireless connections. In this respect, these elements may communicate with outside users (e.g., the police, fire department and so forth) and alert these outside users when an intermittent fault is determined. A receiver 1850 may be coupled to a reactor safety system associated with the reactor 1822 and used to activate reactor safety controller to switch to a stand-by power bus and to call for immediate maintenance on the power bus (e.g., when an intermittent fault is determined). The central computer 128 may include a data base or memory to store various types of information.

The data bus 1810 is any type of data base that can be used to transmit information between electronic devices. The data bus 1810 may be single or multiple wires. The type of wire may be metal, fiber optical cable to mention two examples.

The transmitters 1826 and 1834 may be any type of apparatus used to transmit a modulated signal to detect faults. In one example, the transmitters 1826 and 1834 are the transmitters described with respect to FIG. 4 as described elsewhere herein.

The receiver 1830 may be any type of apparatus used to receive a modulated signal to detect faults. In one example, the receiver 1830 is a receiver as has been described with respect to FIG. 4 as described elsewhere herein.

In one example of the operation of the network in FIG. 18, data associated with at least one building condition or status is sensed by one or more of the sensors 1812, 1814, or 1816. The data from these sensors may be sent over the data bus 1810 and received by the central computer 1828. In addition, a modulated signal may be transmitted by one or both of the transmitters 1834 or 1826 across the bus 1810. The modulated data signal is received at the receiver 1830, which analyzes the received modulated data signal, and determines whether an intermittent fault has occurred on the data bus based upon the analyzing. For example, the receiver 1830 may compare the received signal to an expected pattern and when a discrepancy exists, an intermittent fault is determined to exist. The receiver 1830 may also determine the location of the fault based upon the analysis using approaches that have been described elsewhere herein.

In other aspects, intermittent power bus faults are also detected. In this respect, a modulated power signal is transmitted across the power bus 1808 by the transmitter 1806 and/or the transmitter 1820. The modulated signal is received by the receiver 1832 and the receiver 1832 analyzes the received modulated signal and determines whether an intermittent fault has occurred on the power bus 1806 based upon the analysis. For example, the receiver 1832 may compare the received signal to an expected pattern and when a discrepancy exists, an intermittent fault is determined to exist. The receiver 1832 may also determine the location of the fault based upon the analysis according to the approaches described herein.

In this example, the modulated signals are transmitted from multiple transmitters to a single receiver. Other configurations are possible.

In still other aspects, a modulated carrier signal is transmitted by one of the transmitters 1826 or 1834. When the modulated carrier signal is received at the receiver 1830 without significant distortion at the receiver 1830, a data signal is transmitted from one of the sensors 1812, 1814, or 1816 or central computer 1828, or user interface 1824, over the data bus 1810. The data signal is received at the receiver 1830 and the received data signal is analyzed by the receiver 1830 to determine if an intermittent fault exists on the data bus 1810 (e.g., by comparing it to an expected pattern). The result obtained by the receiver 1830 may be communicated to the central computer 1828 via the data bus 1810 or via some other approach (e.g., a wireless connection from the receiver 1830 to the central computer 1828). Alternatively or in addition, the result may be communicated either across a wired connection or wirelessly to an external device or system at another location (e.g., the police, a central dispatch center, to mention a few examples). Action that can be taken to correct the fault (e.g., replacing the wire).

In another example, a data signal is sent from a transmitter to a receiver. The data signal is sent back from the receiver to the original transmitter. The transmitter compares the signal to what was sent and if there is no discrepancy, a data signal is sent over the data bus (i.e., there is no fault). Otherwise, a fault is determined to exist.

In yet other aspects, the sensing device may be a temperature sensor, a radioactivity sensor, a motion sensor, a pressure sensor, or a humidity sensor. Other examples of sensors or sensing devices are possible.

In another example of the operation of the system of FIG. 18, one or more of the sensors 1812, 1814, and 1816 (that are disposed in the building 1802) sense a condition or status associated with the building 1802. A plurality of modulated signals indicating this information are transmitted across the data bus 1810 that is disposed in the building 1802. Each of the plurality of modulated signals is modulated according to an approach that avoids interference between each of the plurality of signals. The plurality of modulated signals from the sensors 1812, 1814, and 1816 are received, for example, at the central computer 1828, and the central computer 1828 processes the data in the received modulated signals.

In other aspects, a modulated signal is transmitted from the transmitter 1834 or 1806 and across the power bus 1808 that is coupled to the sensors 1812, 1814, or 1816. The modulated signal is received at the receiver 1832. The receiver 1832 analyzes the received modulated signal and determines whether an intermittent fault has occurred on the power bus 1808 based upon the analysis. A similar approach can be used on the data bus 1810 to determine if intermittent faults are present on the data bus 1810.

Various forms of modulation may be used to avoid interference between signals. For example, amplitude shift keying (ASK) modulation, frequency shift keying (FSK) modulation, Phase shift keying (PSK) modulation, Binary shift keying (BSK) modulation, Binary Phase shift keying (BPSK) modulation, quadrature phase shift keying (QPSK) modulation, offset quadrature phase shift keying (OQPSK) modulation, minimum shift keying (MSK) modulation, Gaussian minimum shift keying (GMSK), multiple phase shift keying (M-PSK), Π/4 QPSK modulation may be used. Other examples of modulation approaches may be used to modulate power and/or data signals.

In another example of the operation of the system of FIG. 18, the entity 1802 is not a building but a vehicle and one or more of the sensors 1812, 1814, or 1816 (disposed in the vehicle) sense data and the data is associated with at least one condition or status associated with the vehicle 1802. In this respect, the sensors 1812, 1814, and 1816 may sense interior vehicle temperature, door status (open or closed), and tire pressure. The central computer 1828 receives and processes the data from the sensors via the data bus 1810. A modulated signal is formed and transmitted by the transmitter 1826 and transmitter 1834 across the data bus 1810. The modulated signal is received at the receiver 1830 and the receiver 1830 analyzes the received modulated signal and determines whether an intermittent fault has occurred on the data bus based upon the analyzing. The location of the fault may also be determined via any of the approaches described herein. As described elsewhere herein, the approaches described herein are not limited to vehicles or buildings but can be applied to networks of any size disposed at any location or locations. For instance, some or all of the elements of FIG. 18 may be disposed in an appliance, in a local area network, or a wide area network to mention a few examples.

In other aspects, a modulated signal is transmitted by one or more of the transmitters 1806 and 1834 across the power bus 1808 (that is coupled to the sensors). The modulated signal is received at the receiver 1832 which analyzes the received modulated signal and determines whether an intermittent fault has occurred on the power bus based upon the analyzing. A location for the fault may also be determined according to the approaches described herein.

Figure 19:
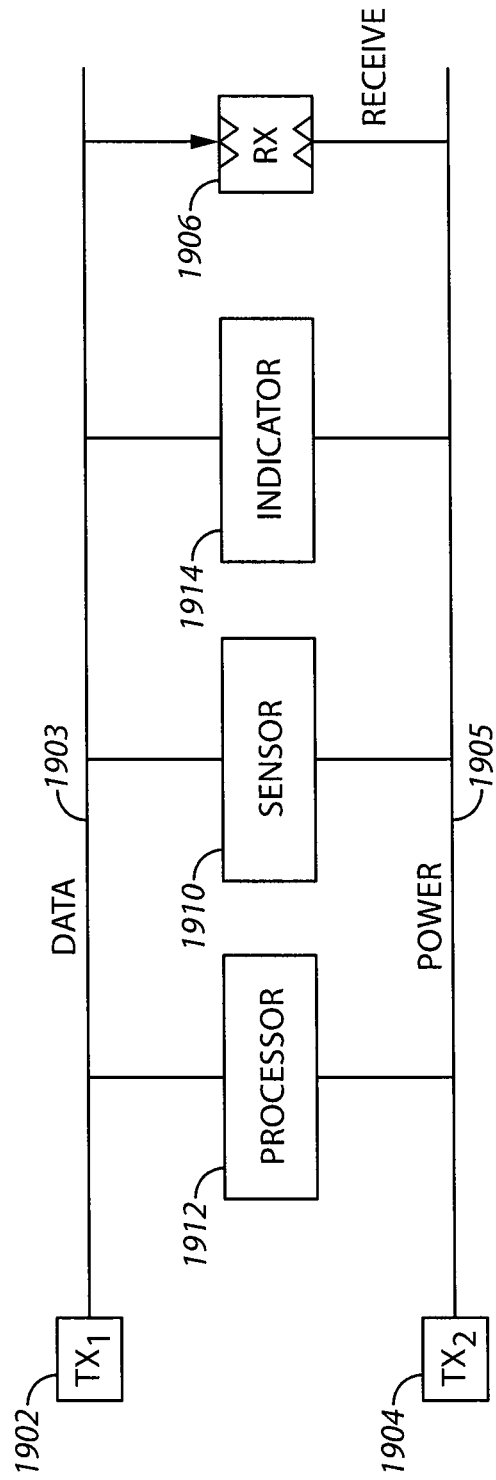
FIG. 19 comprises a diagram of a network including fault determination devices according to various embodiments of the present invention.

Referring now to FIG. 19, one approach of using single receiver for determining intermittent faults at both a data bus 1903 and a power bus 1905. The receiver 1906 may be equipped with two appropriate couplers (e.g., as described elsewhere herein) for each of the data and power buses and applied with the same or different modulation method with the same or different frequency in such a way that the modulated signal on either bus does not create interference with the data or power signals. The coupler and modulation method and frequency of the receiver 1906 for the data bus 1903 may be the same to those of a transmitter 1902 on the data bus 1903, and the coupler and modulation method and frequency of the receiver 1906 for the data bus 1903 must, in one example, be the same or equivalent to those of a transmitter 1904 on the power bus 1905. To provide various applications, one or more sensors 1910, one or more processors 1912, and one or more indicators 1914, for example, are connected to the data bus 1903 at one side and to the power bus 1905 at the other side.

Figure 20:
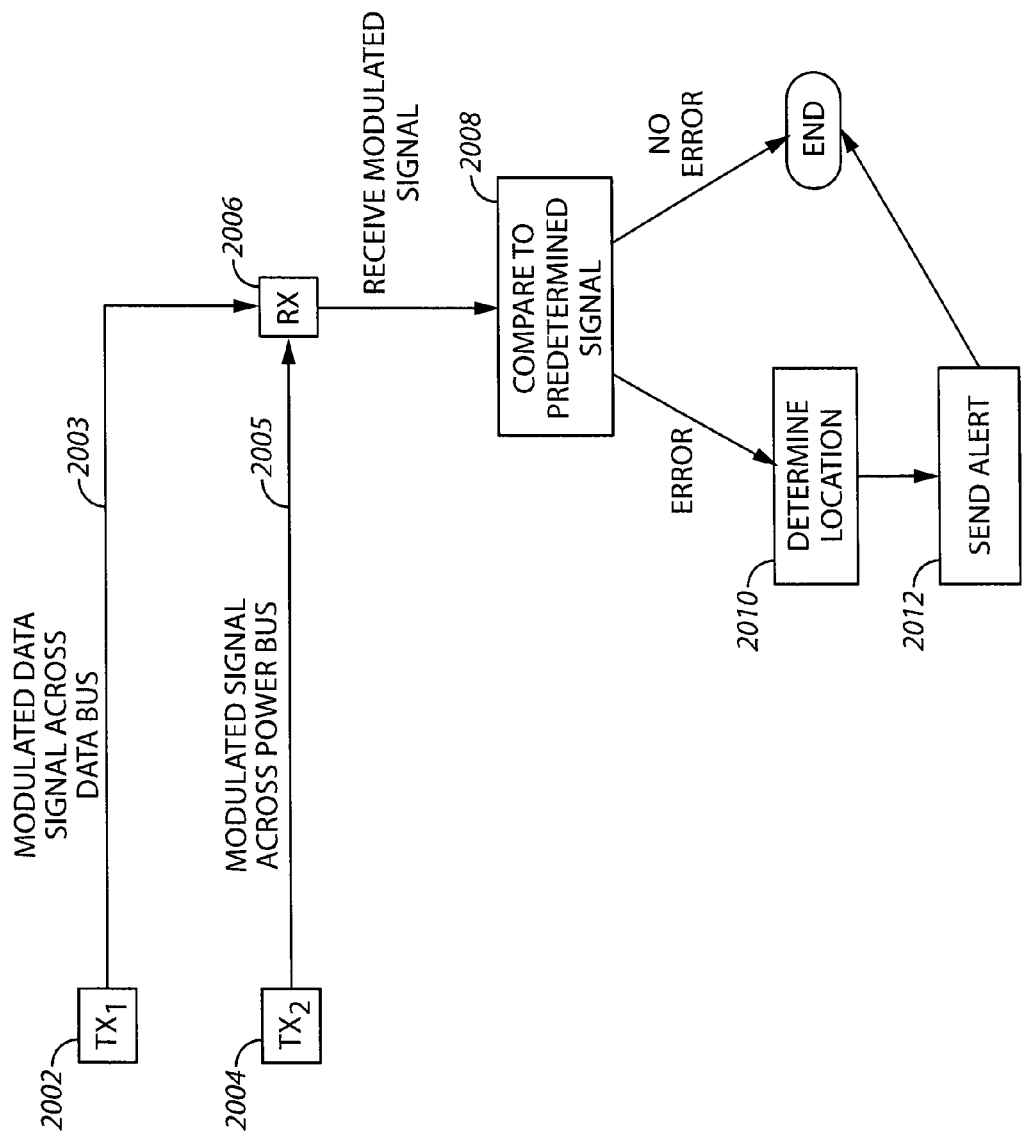
FIG. 20 comprises a flowchart of another fault determination approach according to various embodiments of the present invention.

Referring now to FIG. 20, at step 2002, a transmitter sends a modulated signal 2003 across a data bus. On the data bus, there may be various types of information that may be processed by a processing unit, for example, indicating the physical conditions of a vehicle or building. The processing may result in actions be requested for a user to comply (e.g., increase the temperature, close the door, to mention a few examples). Multiple signals may be sent from multiple transmitters.

At step 2004, a transmitter sends a modulated signal 2005 across the bus. Multiple signals may be sent from multiple transmitters. At step 2006, the modulated signal is received at a single receiver unit (or alternatively, multiple receiver units) coupled for both types of modulated signals.

At step 2008, the receiver compares the modulated signals to a predetermined pattern for each of the both signals. For example, a test pattern stored in a memory may be compared to the received signal.

At step 2008 a determination is made whether an intermittent fault exists on either of the buses and a location for the intermittent fault may also be determined according to the approaches described herein. Otherwise, no intermittent fault is determined to exist. At step 2012, an alert is sent to a user. This information may be presented at any suitable user interface such as a personal computer. The determination that a fault exists and the location of the fault may also be sent to some other entity (e.g., a control center, a dispatch center, the police, the fire department, to mention a few examples).

Figure 22:
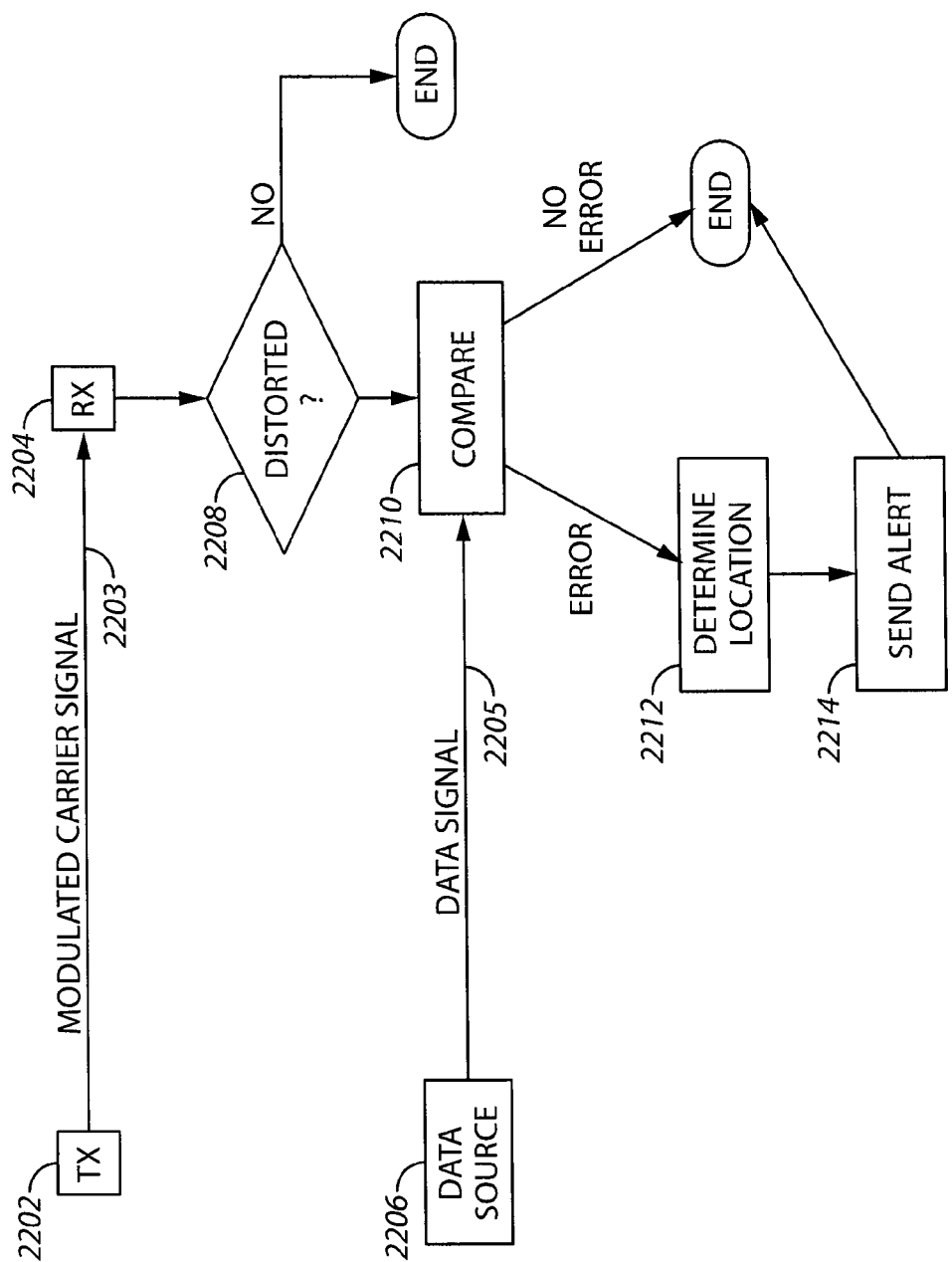
FIG. 22 comprises a flowchart of a fault determination approach according to various embodiments of the present invention.

Referring now to FIG. 22, another approach for determining intermittent faults is described. This can be used in both a data bus (data lines) and a power bus (power lines). At step 2202, a transmitter sends a modulated carrier signal 2203 across a data bus. At step 2206, a data source (e.g., sensor) sends a data signal 2205 across the bus. The data signal 2205 transmitted may include various types of information that may be processed by a processing unit, for example, indicating the physical conditions of a vehicle or building.

At step 2204, the modulated carrier signal is received at the single receiver (or, alternatively, multiple receivers may be used). At step 2208 it is determined if the modulated carrier signal is distorted. If the answer is negative, execution ends. If the answer is affirmative, at step 2210 a comparison is made between a data signal 2205 and a predetermined signal (e.g., a predetermined pattern).

At step 2212 an error is determined and a location for the error may be determined. Otherwise, no error is determined. At step 2214, an alert is sent. This may be presented at any suitable user interface such as a personal computer. The determination that a fault exists and the location of the fault may also be sent to some other entity (e.g., a control center, a dispatch center, the police, the fire department, to mention a few examples).

Figure 21:
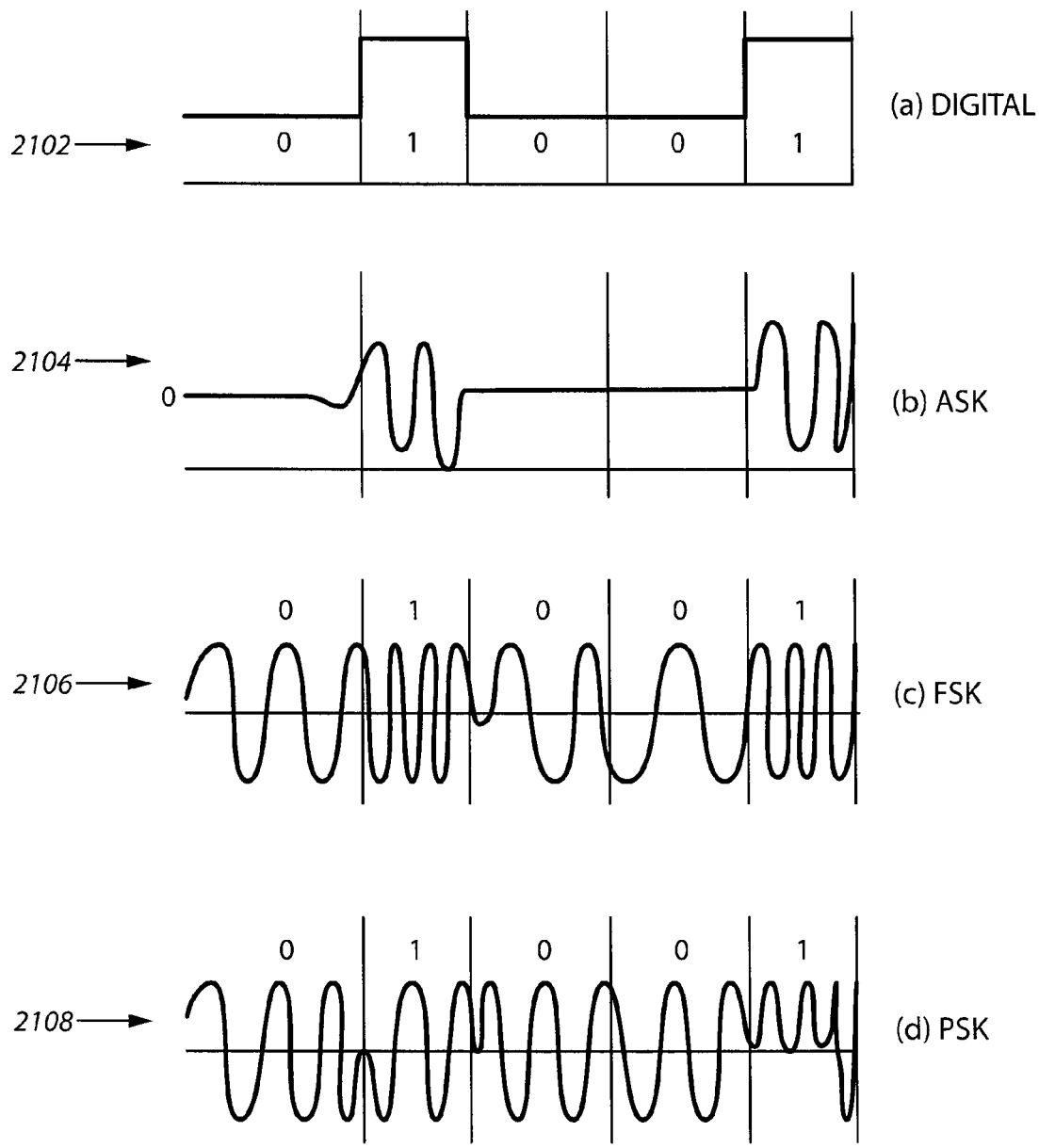
FIG. 21 comprises examples of modulation approaches for the fault determination approaches described herein according to various embodiments of the present invention.

As mentioned, various modulation approaches can be used. Referring now to FIG. 21, various approaches are described. These approaches allow signals transmitted by the transmitters 1806, 1834, 1826, 1830 (as depicted in FIG. 18) from not interfering with each other. These approaches also allow signals from the various sensors from not interfering with each other.

A digital signal 2102 is to be transmitted from a transmitter (e.g., one of the transmitters 1806, 1834, 1826, 1830 shown in FIG. 18). The digital waveform 2102 shown in FIG. 21a may be modulated into an ASK waveform, a FSK modulated waveform 2106, or a PSK modulated 2108.

As used herein "modulation" means facilitating the transfer of information over any type of wired medium. In ASK modulation, the amplitude of the carrier is changed in response to information and all else is kept fixed. A first bit may be transmitted from a transmitter by a carrier of one particular amplitude. To transmit a 0 bit, the amplitude may be changed (with the frequency held constant) as shown in FIG. 21b.

In FSK modulation and as shown in FIG. 21c, the frequency is changed in response to information. More specifically, one particular frequency for a 1 and another frequency for a 0. In this example, $FSK(t)=\sin(2\Pi f_1 t)$ for a 1 is used, and $\sin(2\Pi f_2 t)$ for a 0 is used.

In PSK modulation and as shown in FIG. 21d, the phase of the sinusoidal carrier is changed to indicate information. The term "phase" as used herein refers to the starting angle at which the sinusoidal waveform starts. To transmit a 0 bit, the phase of the sinusoidal waveform is shifted by 180°. Phase shift represents the change in the state of the information in this case.

As already mentioned, it will be appreciated that various modulation approaches can be used. For example, amplitude shift keying (ASK) modulation, frequency shift keying (FSK) modulation, Phase shift keying (PSK) modulation, Binary shift keying (BSK) modulation, Binary Phase shift keying (BPSK) modulation, quadrature phase shift keying (QPSK) modulation, offset quadrature phase shift keying (OQPSK) modulation, minimum shift keying (MSK) modulation, Gaussian minimum shift keying (GMSK), multiple phase shift keying (M-PSK), Π/4 QPSK modulation may be used. Other examples of modulation approaches are possible.

While the invention herein disclosed has been described by means of specific embodiments and applications thereof, numerous modifications and variations could be made thereto by those skilled in the art without departing from the scope of the invention.

What is claimed is:

1. A communication network in a building, the network comprising:
    a power bus;
    a data bus;
    a first transmitter for sending a first modulated signal along the data bus;
    a second transmitter for sending a second modulated signal along the power bus;
    at least one sensing device coupled to the power bus and the data bus, the at least one sensing device configured to sense data associated with at least one building condition or status;
    a data processing module that is connected to the power bus and the data bus, the data processing module being configured to receive and process the data received from the at least one sensing device;
    an error determination apparatus spatially separated from the first transmitter and the second transmitter and that is coupled to the data bus and the power bus, the bus error determination apparatus being configured to receive the first modulated signal and the second modulated signal, analyze the first modulated signal and second modulated signal, and determine whether an intermittent fault has occurred on the data bus or the power bus based upon the analysis and not based upon any reflection of the first modulated signal on the data bus or reflection of the second modulated signal on the power bus, wherein the analysis compares the received first modulated signal to a first expected data pattern and the received second modulated signal to a second data expected pattern.

2. The network of claim 1 wherein the data processing module is configured to determine whether an alarm condition exists in the building.

3. The network of claim 1 wherein the at least one sensing device is selected from the group consisting of: a temperature sensor, a radioactivity sensor, a motion sensor, a pressure sensor, and a humidity sensor.

4. A method of determining faults in a network in a building, the method comprising:

sensing data associated with at least one building condition or status by at least one sensing device;

receiving and processing the data from the at least one sensing device over a data bus;

transmitting a first modulated signal across the data bus from a first transmitter, receiving the first modulated signal at a single receiver, analyzing the received first modulated signal, and determining whether an intermittent fault has occurred on the data bus based upon the analyzing and not based upon any reflection of the first modulated signal on the data bus;

transmitting a second modulated signal across a power bus from a second transmitter that is coupled to the at least one sensing device, receiving the second modulated signal at the single receiver, analyzing the received second signal, and determining whether an intermittent fault has occurred on the power bus based upon the analyzing and not based upon any reflection of the second modulated signal on the power bus, wherein the analyzing compares the received first modulated signal to a first expected data pattern and the received second modulated signal to a second expected data pattern.

5. The method of claim 4 wherein transmitting the first modulated signal comprises transmitting a carrier signal and when the carrier signal is received with significant distortion at a receiver, transmitting a data signal over the data bus and wherein receiving comprises receiving the data signal at the receiver and analyzing the data signal to determine if an intermittent fault exists on the data bus.

6. The method of claim 4 wherein the at least one sensing device is selected from the group consisting of: a temperature sensor, a radioactivity sensor, a motion sensor, a pressure sensor, and a humidity sensor.

7. The network of claim 1 wherein the first modulated signal and the second modulated signal are modulated according to an approach selected from the group consisting of: amplitude shift keying (ASK) modulation, frequency shift keying (FSK) modulation, Phase shift keying (PSK) modulation, Binary shift keying (BSK) modulation, Binary Phase shift keying (BPSK) modulation, quadrature phase shift keying (QPSK) modulation, offset quadrature phase shift keying (OQPSK) modulation, minimum shift keying (MSK) modulation, Gaussian minimum shift keying (GMSK), and multiple phase shift keying (M-PSK), Π/4 QPSK modulation.

* * * * *